(12) United States Patent
Miyaharu et al.

(10) Patent No.: US 9,594,315 B2
(45) Date of Patent: Mar. 14, 2017

(54) DETECTION APPARATUS, LITHOGRAPHY APPARATUS AND METHOD OF MANUFACTURING ARTICLE

(71) Applicant: CANON KABUSHIKI KAISHA, Tokyo (JP)

(72) Inventors: Takafumi Miyaharu, Utsunomiya (JP); Kazuhiko Mishima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 181 days.

(21) Appl. No.: 14/474,980

(22) Filed: Sep. 2, 2014

(65) Prior Publication Data
US 2015/0062553 A1    Mar. 5, 2015

(30) Foreign Application Priority Data

Sep. 3, 2013   (JP) ................. 2013-182473

(51) Int. Cl.
*G03F 7/20* (2006.01)
*G03F 9/00* (2006.01)
*G01D 5/38* (2006.01)

(52) U.S. Cl.
CPC ............ *G03F 9/7042* (2013.01); *G01D 5/38* (2013.01); *G03F 9/7038* (2013.01); *G03F 9/7049* (2013.01); *G03F 9/7076* (2013.01); *G03F 9/7088* (2013.01)

(58) Field of Classification Search
None
See application file for complete search history.

(56) References Cited

U.S. PATENT DOCUMENTS

| | | | | |
|---|---|---|---|---|
| 4,962,318 A * | 10/1990 | Nishi | ................ | G03F 9/7088 250/548 |
| 5,754,300 A * | 5/1998 | Magome | ............... | G03F 9/70 250/548 |
| 5,943,135 A * | 8/1999 | Mishima | ............... | G03F 9/70 250/548 |
| 6,646,714 B2 * | 11/2003 | Ohsaki | ............ | G03F 7/70483 355/52 |

(Continued)

FOREIGN PATENT DOCUMENTS

| | | | | |
|---|---|---|---|---|
| JP | 2003-322505 A | 11/2003 | | |
| JP | 2007-042965 A | 2/2007 | | |
| NL | WO 2015113724 A1 * | 8/2015 | ......... | G03F 7/70625 |

*Primary Examiner* — Steven H Whitesell Gordon
(74) *Attorney, Agent, or Firm* — Rossi, Kimms & McDowell LLP

(57) ABSTRACT

The present invention provides a detection apparatus for detecting a position of a detection target, including an illumination optical system configured to perform dark-field illumination on a reference mark, and a detection optical system including a sensor configured to detect light from the reference mark and an optical system configured to guide the light from the reference mark to the sensor, and configured to detect a position of the reference mark in a first direction, wherein the reference mark includes one mark element in the first direction, and a width of the mark element in the first direction is set such that two edges of the mark element in the first direction are detected as one peak when the sensor detects the light from the reference mark.

20 Claims, 14 Drawing Sheets

(56) References Cited

U.S. PATENT DOCUMENTS

| | | | | |
|---|---|---|---|---|
| 7,009,704 B1* | 3/2006 | Nikoonahad | ....... | G03F 7/70633 |
| | | | | 356/399 |
| 2012/0328725 A1* | 12/2012 | Minoda | ................ | G03F 7/0002 |
| | | | | 425/150 |
| 2013/0100459 A1* | 4/2013 | Iwai | ........................ | G01D 5/38 |
| | | | | 356/499 |
| 2013/0271740 A1* | 10/2013 | Quintanilha | ............ | G03F 1/144 |
| | | | | 355/67 |
| 2015/0138523 A1* | 5/2015 | Jak | ...................... | G03F 7/70625 |
| | | | | 355/67 |

* cited by examiner

DETECTION APPARATUS, LITHOGRAPHY APPARATUS AND METHOD OF MANUFACTURING ARTICLE

BACKGROUND OF THE INVENTION

Field of the Invention

The present invention relates to a detection apparatus, a lithography apparatus, and a method of manufacturing an article.

Description of the Related Art

An imprint technique is a technique of forming a micropattern on a substrate by using a mold on which the pattern is formed. An example of the imprint technique is a photo-curing method. In the imprint technique using this photo-curing method, a resin (photocuring resin) as an imprint material is supplied to a shot region (imprint region) of a substrate. Then, the resin on the substrate is irradiated with light in a state in which a pattern of a mold is in contact with (imprinted on) the resin, thereby curing the resin. After that, the pattern of the resin is formed on the substrate by separating (releasing) the mold from the cured resin.

When bringing the mold into contact with the resin on the substrate, it is necessary to accurately align the substrate and mold. As a method to be used in an imprint apparatus, a so-called, die-by-die method is known in which a substrate and mold are aligned by detecting a mark (mold-side mark) formed on the mold and a mark (substrate-side mark) formed in each shot region of the substrate.

The imprint apparatus adopts TTM (Through The Mold) alignment which detects a substrate-side mark through a mold. Also, the TTM alignment uses a dark-field detection system which detects diffracted light generated by a mold-side mark and substrate-side mark (see Japanese Patent Laid-Open No. 2007-42965). The dark-field detection system is preferably arranged near a mold, but mechanical interference may occur between the dark-field detection system and the upper portion of the mold. When emitting light for curing a resin on a substrate, therefore, the dark-field detection system must be retracted from the vicinity (above the mold) of the mold. To avoid this mechanical interference, the use of an imaging optical system which projects an alignment mark is known. The use of the imaging optical system makes it unnecessary to retract the dark-field detection system when irradiating the resin on the substrate with light. This can increase the productivity of the imprint apparatus.

In the TTM alignment using the imaging optical system, however, the aberration of the imaging optical system causes an alignment error because the alignment mark projected by the imaging optical system is detected. The main cause of this alignment error is the asymmetry of an image such as a coma aberration. To decrease the alignment error, it is necessary to decrease the aberration of the dark-field detection system and the aberration of the imaging optical system. An interferometer is generally used when measuring the aberration of an optical system in an exposure apparatus. However, this increases the apparatus cost, and increases the apparatus size because an installation space for the interferometer must be secured.

Japanese Patent Laid-Open No. 2007-42965 has disclosed a technique which measures a coma aberration and spherical aberration by using an image of a phase pattern, but this technique has a low measurement accuracy because the sensitivity to the aberration is low. Also, the dark-field detection system uses scattered light or diffracted light, and hence has a light amount smaller than that of a bright-field detection system. This increases the ratio of an error caused by electrical noise of a sensor such as a photoelectric conversion element.

SUMMARY OF THE INVENTION

The present invention provides a technique advantageous in obtaining the aberration of a test optical system.

According to one aspect of the present invention, there is provided a detection apparatus for detecting a position of a detection target, including an illumination optical system configured to perform dark-field illumination on a reference mark, and a detection optical system including a sensor configured to detect light from the reference mark and an optical system configured to guide the light from the reference mark to the sensor, and configured to detect a position of the reference mark in a first direction, wherein the reference mark includes one mark element in the first direction, and a width of the mark element in the first direction is set such that two edges of the mark element in the first direction are detected as one peak when the sensor detects the light from the reference mark.

Further aspects of the present invention will become apparent from the following description of exemplary embodiments with reference to the attached drawings.

DESCRIPTION OF THE EMBODIMENTS

Figure 1:
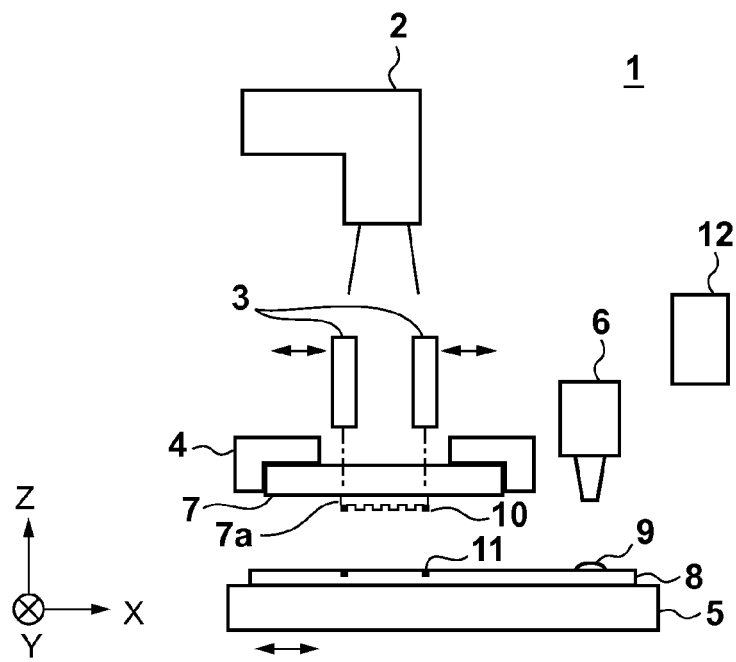
FIG. 1 is a schematic view showing the basic configuration of an imprint apparatus.

Preferred embodiments of the present invention will be described below with reference to the accompanying drawings. Note that the same reference numerals denote the same members throughout the drawings, and a repetitive description thereof will not be given.

FIG. 1 is a schematic view showing the basic configuration of an imprint apparatus 1. The imprint apparatus 1 is a lithography apparatus which is used in the manufacture of a device such as a semiconductor device, and in which an uncured resin (imprint material) 9 on a substrate 8 such as a wafer is molded by a mold 7, thereby forming a pattern of the resin 9 on the substrate 8. The imprint apparatus 1 adopts a photocuring method. In the following description, the X- and Y-axes perpendicular to each other are taken in a plane parallel to the surface of the substrate 8, and the Z-axis is taken in a direction perpendicular to the X- and Y-axes. The imprint apparatus 1 includes an irradiation unit 2, detection system 3, mold holding unit 4, substrate stage 5, and resin supply unit (dispenser) 6.

After an imprinting process of bringing the mold 7 into contact with the resin 9 on the substrate 8, the irradiation unit 2 irradiates the resin 9 with ultraviolet light through the mold 7 in the state in which the mold 7 and resin 9 are in contact with each other, in order to cure the resin 9. The irradiation unit 2 includes a light source, and a plurality of optical elements for uniformly irradiating a pattern surface 7a of the mold 7 with the ultraviolet light emitted from the light source and having a predetermined shape. A region to be irradiated with the ultraviolet light by the irradiation unit 2 is set to be equal to or slightly larger than the area of the pattern surface 7a. This is so in order to suppress, by setting a minimum necessary ultraviolet irradiation region, the shift and distortion of a pattern to be transferred to the resin 9 due to the expansion of the mold 7 or substrate 8 caused by the heat of ultraviolet irradiation. It is also possible to prevent ultraviolet light reflected by the substrate 8 or the like from reaching the resin supply portion 6 and curing the resin 9 remaining in a resin discharge portion of the resin supply unit 6, thereby preventing an abnormal operation of the resin supply unit 6.

As the light source of the irradiation unit 2, it is possible to adopt, for example, a high-pressure mercury lamp, various excimer lamps, an excimer laser, and a light-emitting diode. The light source of the irradiation unit 2 is properly selected in accordance with the characteristics of the resin 9. However, the present invention is not limited by the type, number, wavelength, and the like of the light source of the irradiation unit 2.

The mold 7 has a predetermined pattern (for example, a projection-and-recess pattern such as a circuit pattern) three-dimensionally formed on the pattern surface 7a opposing the substrate 8. The mold 7 is made of a material such as quartz capable of transmitting the ultraviolet light from the irradiation unit 2.

The mold holding unit 4 includes a mold chuck for holding the mold 7 by a vacuum suction force or electrostatic force, and a moving mechanism for moving the mold chuck in the Z-axis direction in order to bring the mold 7 into contact with the resin 9. In addition, the mold holding unit 4 includes a correction mechanism for correcting the distortion of the pattern to be transferred to the resin 9 by deforming the mold 7 in the X- and Y-axis directions.

The mold 7 and substrate 8 are so arranged as to have a space in the Z-axis direction in an XYZ coordinate system. An imprinting operation and release operation in the imprint apparatus 1 can be implemented by moving the mold 7 in the Z-axis direction, or moving, for example, the substrate stage 5 in the Z-axis direction. These operations may also be implemented by simultaneously or sequentially moving both the mold 7 and substrate stage 5.

The substrate stage 5 holds the substrate 8 by vacuum suction or the like, and moves in the XY plane. The substrate 8 is, for example, a single-crystal wafer, and the ultraviolet-curing resin 9 to be molded by the mold 7 is supplied (dispensed) to the surface of the substrate 8.

The detection system 3 detects the relative positions of the mold 7 and substrate 8 as detection targets. The detection system 3 detects the relative positions of the mold 7 and substrate 8 by optically detecting marks 10 and 11 respectively arranged on the mold 7 and substrate 8. The detection system 3 is arranged such that the optical axis of the detection system 3 is perpendicular to the surface of the substrate 8. The detection system 3 is so configured as to be movable in the X- and Y-axis directions in accordance with the positions of the marks 10 and 11 respectively arranged on the mold 7 and substrate 8. Also, the detection system 3 is so configured as to be movable in the Z-axis direction in order to focus the optical system upon the positions of the marks 10 and 11. Based on the relative positions of the mold 7 and substrate 8 detected by the detection system 3, the substrate stage 5, the correction mechanism for deforming the mold 7, and the like are controlled.

The resin supply unit 6 supplies the uncured resin 9 onto the substrate 8. The resin 9 is a photocuring resin which cures when receiving ultraviolet light, and is properly selected in accordance with, for example, the type of semiconductor device. It is also possible to arrange the resin supply unit 6 not inside but outside the imprint apparatus 1, and load the substrate 8 pre-coated with the resin 9 into the imprint apparatus 1. In this case, the processing speed of the imprint apparatus 1 can be increased because no coating process is performed inside the imprint apparatus 1. In addition, the manufacturing cost of the whole imprint apparatus 1 can be decreased because the resin supply unit 6 is unnecessary.

The imprinting process performed by the imprint apparatus 1 will be explained below. First, a controller 12 causes a substrate transfer unit to load the substrate 8 into the imprint apparatus 1, and causes the substrate stage 5 to hold the substrate 8. Then, the controller 12 moves the substrate stage 5 to the resin supply position of the resin supply unit 6, and causes the resin supply unit 6 to supply (dispense) the resin 9 to a predetermined shot region (imprint region) of the substrate 8. After that, the controller 12 moves the substrate stage 5 so that the predetermined shot region of the substrate 8 is positioned immediately below the mold 7.

Subsequently, the controller 12 causes the moving mechanism of the mold holding unit 4 to move the mold 7, thereby bringing the mold 7 into contact with the resin 9 on the substrate 8 (an imprinting process). In this step, the resin 9 brought into contact with the mold 7 flows along the pattern surface 7a of the mold 7. Also, in this state, the controller 12 causes the detection system 3 to detect the marks 10 and 11 respectively arranged on the mold 7 and substrate 8, aligns the mold 7 and substrate 8 by moving the substrate stage 5, and deforms the mold 7 by the correction mechanism. When the flow of the resin 9 to the pattern surface 7a, the alignment of the mold 7 and substrate 8, and the deformation of the mold 7 are sufficiently performed, the controller 12 causes the irradiation unit 2 to emit ultraviolet light from the back surface (upper surface) of the mold 7. Consequently, the ultraviolet light transmitted through the mold 7 cures the resin 9 (a curing process). In this step, the detection system 3 is retracted so as not to block the optical path of the ultraviolet light from the irradiation unit 2. Then, the controller 12 causes the moving mechanism of the mold holding unit 4 to widen the space between the mold 7 and resin 9, thereby releasing the mold 7 from the cured resin 9 on the substrate 8 (a releasing process). As a consequence, the pattern of the mold 7 is transferred onto the substrate 8.

Figure 2:
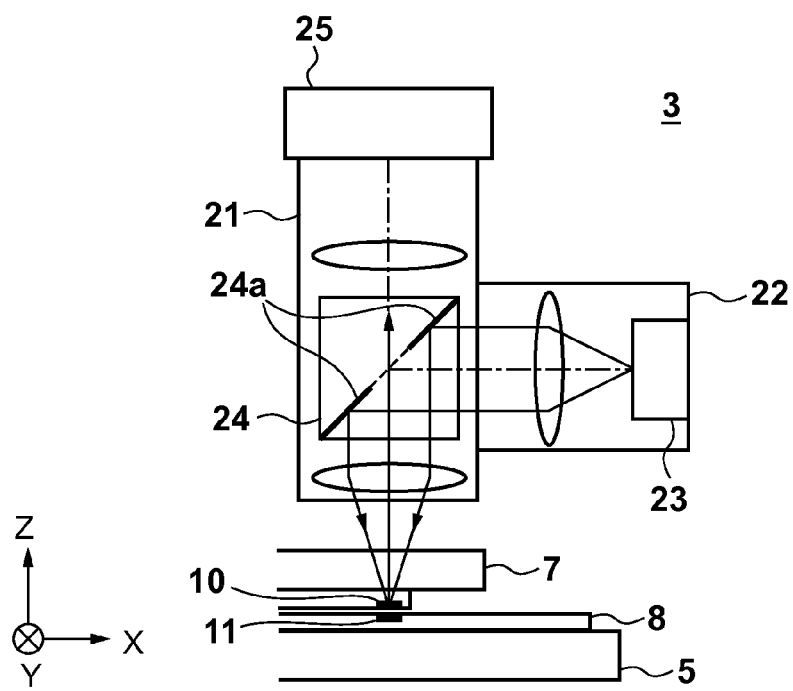
FIG. 2 is a view showing an example of the arrangement of a detection system.

Details of the detection system 3 and the marks 10 and 11 respectively arranged on the mold 7 and substrate 8 will now be explained. FIG. 2 is a view showing an example of the arrangement of the detection system 3. The detection system 3 includes a detection optical system 21 and illumination optical system 22. The illumination optical system 22 guides light from a light source 23 onto the same optical axis as that of the detection optical system 21 via a prism 24 and the like, and obliquely illuminates the marks 10 and 11 at the same time.

The light source 23 is, for example, a halogen lamp or LED, and emits visible light, infrared light, or the like other than ultraviolet light which cures the resin 9. The detection optical system 21 and illumination optical system 22 are so configured as to share some optical elements forming these systems. The prism 24 is arranged in, or in the vicinity of, the pupil plane of the detection optical system 21 and illumination optical system 22. Each of the marks 10 and 11 is formed by a grating pattern. The detection optical system 21 forms, on the image sensing surface of an image sensor 25, interference fringes or moire fringes generated by diffracted light diffracted by the marks 10 and 11 illuminated by the illumination optical system 22. A CCD sensor, CMOS sensor, or the like is used as the image sensor 25.

The cemented surfaces of the prism 24 have a reflecting film 24a for reflecting light from the peripheral portion of the pupil plane of the illumination optical system 22. The reflecting film 24a also functions as an aperture stop which defines the pupil size of the detection optical system 21 (or a numerical aperture $NA_o$ of the detection optical system 21). The prism 24 may be a half prism having a semitransparent film on the cemented surfaces, and may also be replaced with a plate-like optical element having a reflecting surface.

Figure 3:
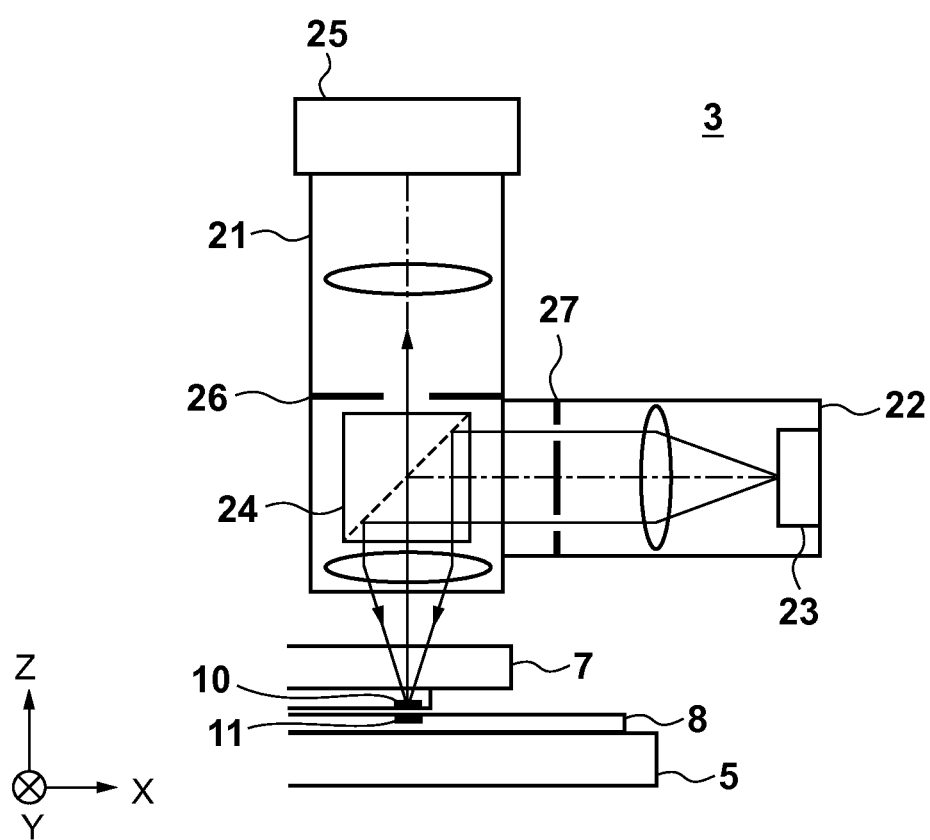
FIG. 3 is a view showing another example of the arrangement of the detection system.

The position of the prism 24 need not be the pupil plane or the vicinity of the pupil plane of the detection optical system 21 and illumination optical system 22. In this case, as shown in FIG. 3, the detection system 21 has an aperture stop 26 in the pupil plane, and the illumination optical system 22 has an aperture stop 27 in the pupil plane. Also, the prism 24 is, for example, a half prism having a semitransparent film on the cemented surfaces.

Figure 4:
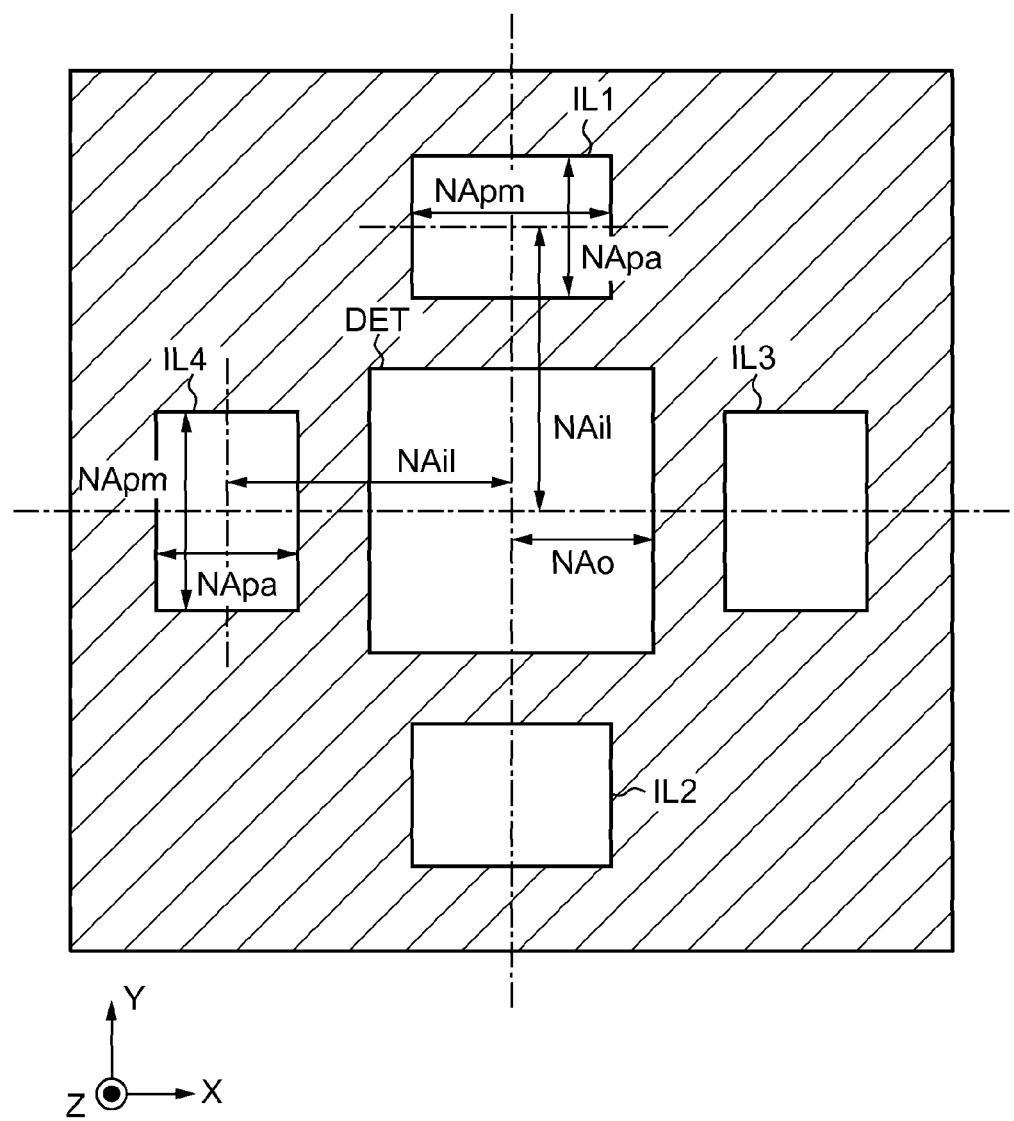
FIG. 4 is a view showing the relationship between light intensity distributions (effective light sources) formed in the pupil plane of an illumination optical system and the detection aperture of a detection optical system.

FIG. 4 is a view showing the relationship between light intensity distributions (effective light sources) IL1 to IL4 formed in the pupil plane of the illumination optical system 22, and a detection aperture DET of the detection optical system 21. In FIG. 4, the sizes of the effective light sources IL1 to IL4 of the illumination optical system 22 and the detection aperture DET of the detection optical system 21 are indicated by the numerical aperture (NA). The illumination optical system 22 forms an effective light source including first, second, third, and fourth poles IL1, IL3, IL2, and IL4 in the pupil plane. Each of the first, second, third, and fourth poles IL1, IL3, IL2, and IL4 has an $NA_{pm} \times NA_{pa}$ rectangular shape. The centers of the first and third poles IL1 and IL2 are arranged in positions spaced apart by $NA_{il}$ from coordinates (0, 0) in the positive and negative directions, respectively, of the Y-axis. The centers of the second and fourth poles IL3 and IL4 are arranged in positions spaced apart by $NA_{il}$ from the coordinates (0, 0) in the positive and negative directions, respectively, of the X-axis. Thus, the illumination optical system 22 is so configured as to obliquely illuminate the marks 10 and 11. An incident angle θ at which the light from the illumination optical system 22 enters the marks 10 and 11 is represented by:

$$\theta = \sin^{-1}(NA_{il}) \quad (1)$$

The detection aperture DET of the detection optical system 21 has a square shape having the coordinates (0, 0) as a center, and a length of $2 \times NA_o$ on each side. The illumination optical system 22 and detection optical system 21 are configured so that $NA_o$, $NA_{pa}$, and $NA_{il}$ satisfy inequality (2) below. In other words, the detection system 3 has a dark-field configuration which does not detect regularly reflected light (0th-order diffracted light) from the marks 10 and 11 (that is, which performs dark-field illumination on the marks 10 and 11).

$$NA_O < NA_{il} - NA_{pa}/2 \quad (2)$$

Figure 5A:
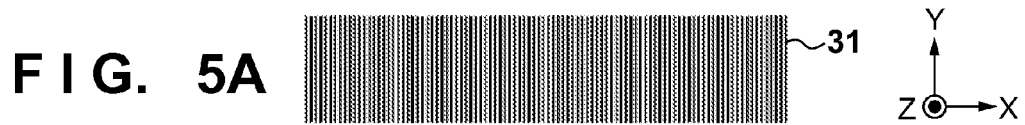
FIGS. 5A to 5D are views for explaining the principle of the generation of moire fringes.
Figure 5B:
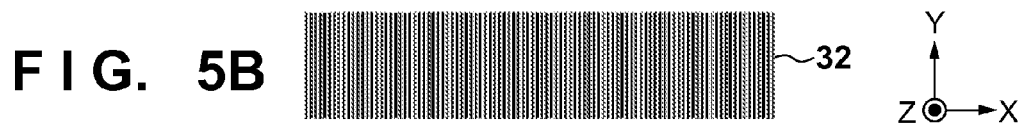
Figure 5C:
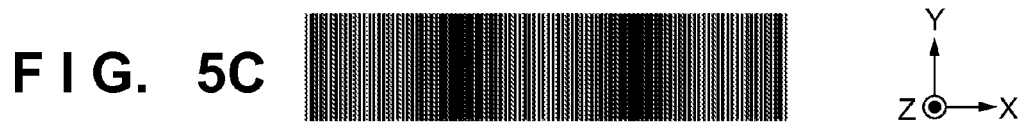
Figure 5D:
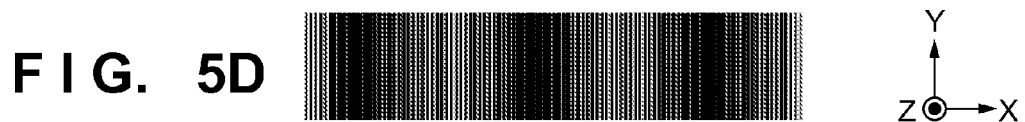

The principle of the generation of moire fringes and a method of detecting the relative positions of the mold 7 and substrate 8 by using the moire fringes will be explained. When grating patterns 31 and 32 having slightly different grating pitches as shown in FIGS. 5A and 5B are overlaid on each other, diffracted light components from the two grating patterns 31 and 32 interfere with each other. Consequently, as shown in FIG. 5C, interference fringes (moire fringes) having a period reflecting the difference between the grating pitches are generated. The moire fringes change the positions of brightness and darkness (the phases of the fringes) in accordance with the relative positions of the grating patterns 31 and 32. For example, when one of the grating patterns 31 and 32 is shifted in the X direction, the moire fringes shown in FIG. 5C change to moire fringes shown in FIG. 5D. The moire fringes are generated as large-period fringes by enlarging the actual shift amount between the grating patterns 31 and 32. Even when the resolving power of the detection optical system 21 is low, therefore, it is possible to accurately detect the relative positions of the grating patterns 31 and 32.

Figure 6A:
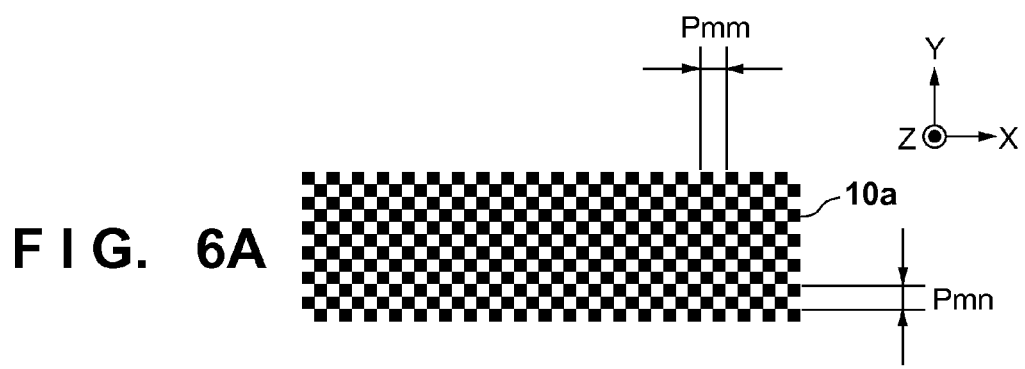
FIGS. 6A and 6B are views showing examples of a grating pattern for generating moire fringes.
Figure 6B:
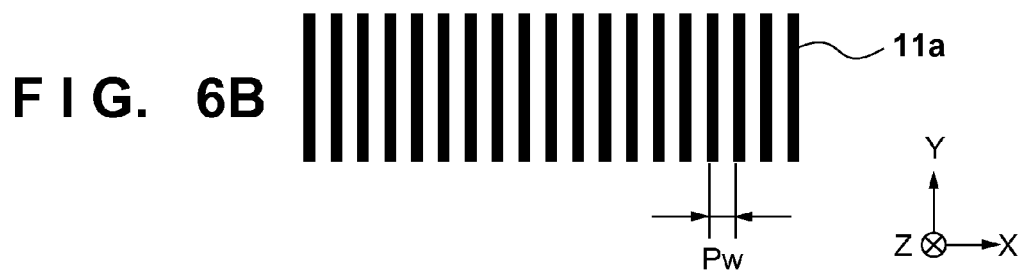

Assume that in order to detect the moire fringes, the grating patterns 31 and 32 are detected in a bright field (the grating patterns 31 and 32 are vertically illuminated, and diffracted light components vertically diffracted by the grating patterns 31 and 32 are detected). In this case, the detection system 3 detects the 0th-order diffracted light from one or both of the grating patterns 31 and 32 as well. The 0th-order diffracted light from one of the grating patterns 31 and 32 decreases the contrast of the moire fringes. As described previously, therefore, the detection system 3 has a dark-field configuration which does not detect the 0th-order diffracted light. To detect the moire fringes even by the dark-field configuration, one of the marks 10 and 11 is formed into a checkered grating pattern as shown in FIG. 6A, and the other one of the marks 10 and 11 is formed into a grating pattern as shown in FIG. 6B. There is basically no difference regardless of whether the mark 10 arranged on the mold 7 or the mark 11 arranged on the substrate 8 is formed into a checkered grating pattern. In the following description, however, the mark 10 is a checkered grating pattern 10a shown in FIG. 6A, and the mark 11 is a grating pattern 11a shown in FIG. 6B.

Each of the grating patterns 10a and 11a is a mark for detecting the relative positions of the mold 7 and substrate 8 in the X-axis direction (a first direction). The grating pattern 10a has a grating pitch $P_{mm}$ in the X-axis direction and a grating pitch $P_{mn}$ in the Y-axis direction. The grating pitch 11a has a grating pitch $P_w$ different from $P_{mm}$ in only the X-axis direction.

Figure 7A:
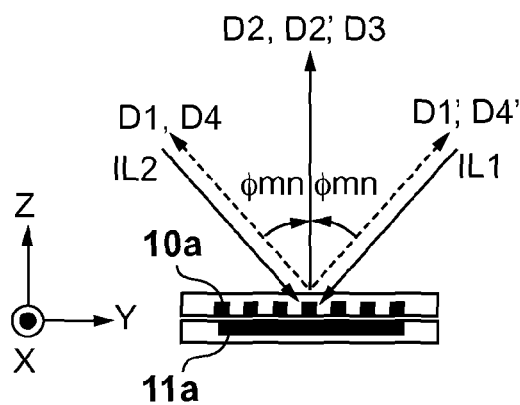
FIGS. 7A to 7D are views for explaining the principle of detecting moire fringes by using the detection system.
Figure 7B:
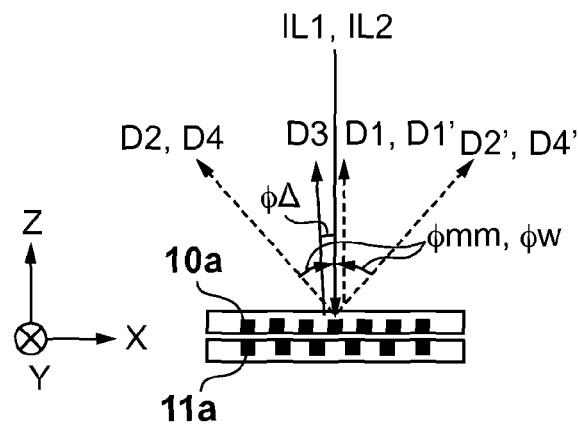

The principle of detecting the moire fringes by the detection system 3 with the grating patterns 10a and 11a being overlaid on each other will be explained with reference to FIGS. 7A to 7D. FIGS. 7A and 7B are views showing the grating patterns 10a and 11a viewed in the X-axis direction and Y-axis direction, respectively. Moire fringes for detecting the relative positions of the mold 7 and substrate 8 in the X-axis direction are generated by (the light intensity distribution of) the first pole IL1 and (the light intensity distribution of) the third pole IL2 arranged on the Y-axis in the pupil plane of the illumination optical system 22. Letting d be the grating pitch, λ be the wavelength of the light from the illumination optical system 22, and n be the diffraction order, a diffraction angle φ of the grating patterns 10a and 11a is represented by:

$$\sin \phi = n\lambda/d \quad (3)$$

Accordingly, letting $\phi_{mm}$ and $\phi_{mn}$ be the diffraction angles of the grating pattern 10a in the X-axis direction and Y-axis direction, respectively, and $\phi_w$ be the diffraction angle of the grating pattern 11a, equations (4), (5), and (6) below hold:

$$\sin \phi_{mn} = n\lambda/Pmm \quad (4)$$

$$\sin \phi_{mn} = n\lambda/Pmn \quad (5)$$

$$\sin \phi_W = n\lambda/Pw \quad (6)$$

Referring to FIG. 7A, the grating patterns 10a and 11a are obliquely illuminated along the Y-axis direction as a non-measurement direction by the first and third poles IL1 and IL2 arranged on the Y-axis direction (non-measurement direction) in the pupil plane of the illumination optical system 22. Light components (0th-order diffracted light components) D1 and D1' regularly reflected by the grating patterns 10a and 11a dot not enter the detection optical system 21 because the detection system 3 satisfies inequality (2).

D2 and D2' indicate diffracted light components diffracted by the ±1st orders by only the grating pattern 10a, and D3 indicates diffracted light diffracted by the +/−1st order by the grating pattern 10a and diffracted by the −/+1st order by the grating pattern 11a. D3 is diffracted light to be used to detect the relative positions of the mold 7 and substrate 8 by the detection system 3. The diffracted light components D2, D2', and D3 diffracted at only the angle $\phi_{mn}$ by the grating pattern 10a having the grating pitch $P_{mn}$ in the Y-axis direction exit at an angle at which they are detected by the detection optical system 21 with respect to the Y-axis.

Of the diffracted light components except for the 0th-order diffracted light, to detect diffracted light having a high diffraction intensity, that is, the diffracted light D3 diffracted by the +/−1st order by the grating pattern 10a and diffracted by the −/+1st order by the grating pattern 11a, $P_{mn}$, $NA_o$, $NA_{il}$, and $NA_{pa}$ satisfy equation (7) below. In other words, the detection system 3 can detect diffracted light in the Y-axis direction at the wavelength λ within the range meeting equation (7):

$$|NA_{il}-|\sin \phi_{mn}||=|NA_{il}-\lambda/P_{mn}|<NA_O+NA_{pa}/2 \quad (7)$$

The detection system 3 can most efficiently detect the diffracted light D3 when the diffracted light D3 is perpendicular to the Y-axis direction. Letting $\lambda_c$ be the central wavelength of the light from the light source 23, therefore, the illumination conditions of the illumination optical system 22 and the grating pitch $P_{mn}$ of the grating pattern 10a are preferably adjusted to satisfy:

$$NA_{il}-\lambda_c/P_{mn}=0 \quad (8)$$

Thus, in the Y-axis direction (non-measurement direction), the grating pattern 10a is obliquely illuminated, and the diffracted light diffracted in the non-measurement direction by the grating pattern 10a is detected.

Next, the diffracted light in the X-axis direction as a measurement direction will be explained. Referring to FIG. 7B, the first and third poles IL1 and IL2 arranged on the Y-axis in the pupil plane of the illumination optical system 22 enter the grating patterns 10a and 11a in a direction perpendicular to the X-axis. When taking the +/−1st-order diffracted light as an example as in the case of the Y-axis direction, the diffracted light D3 diffracted by the +/−1st order by the grating pattern 10a and diffracted by the −/+1st order by the grating pattern 11a enters the detection optical system 21 at a small angle with respect to the X-axis because $P_{mm}$ and $P_w$ are close.

Figure 7C:
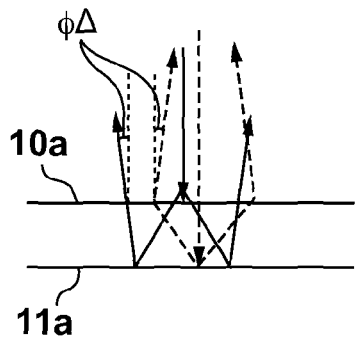
Figure 7C:
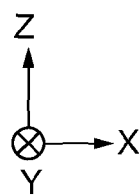

FIG. 7C shows the way the diffracted light D3 is diffracted. Solid arrows indicate diffracted light diffracted by the +/−1st order by the grating pattern 10a, diffracted by the −/+1st order by the grating pattern 11a, and transmitted through the mold 7. Also, dotted arrows indicate diffracted light transmitted through the grating pattern 10a, diffracted by the −/+1st order by the grating pattern 11a, and diffracted by the +/−1st order by the grating pattern 10a. In this case, a diffraction angle $\phi_\Delta$ is represented by:

$$\sin \phi_\Delta = \lambda \times |P_w - P_{mm}|/(P_{mm}P_w) \quad (9)$$

When $|P_w-P_{mm}|/(P_{mm}P_w)=1/P_\Delta$ in equation (9), sin $\phi_\Delta$ is represented by:

$$\sin \phi_\Delta = \lambda/P_\Delta \quad (10)$$

Equation (10) means that interference fringes having a period $P_\Delta$ appear due to the diffracted light D3. The interference fringes are moire fringes, and their period depends on the difference between the grating pitches of the grating patterns 10a and 11a. Since the grating pattern 10a is a checkered grating pattern, however, the period of the generated moire pattern is $P_\Delta/2$. In this case, the relative misregistration between the mold 7 and substrate 8 is enlarged to the shift between the bright and dark portions of the moire fringes, accurate alignment can be performed even when the resolving power of the detection optical system 21 is low.

Referring to FIG. 7B, the diffracted light components D2 and D2' diffracted by the 1st order by only the grating pattern 10a or the diffracted light components D4 and D4' diffracted by the 1st order by only the grating pattern 11a exit at the angle $\phi_{mm}$ or $\phi_w$. The diffracted light components D2, D2', D4', and D4' do not generate moire fringes but generate noise, so it is necessary to prevent them from being detected by the detection optical system 21. Accordingly, the grating pitch $P_{mm}$ of the grating pattern 10a, the grating pitch $P_w$ of the grating pattern 11a, and the numerical aperture $NA_o$ of the detection aperture DET of the detection system 3 are so set as to satisfy:

$$NA_o + NA_{pm}/2 < |\sin \phi_{mn}| = \lambda/P_{mm} \quad (11)$$

$$NA_o + NA_{pm}/2 < |\sin \phi_W| = \lambda/P_w \quad (12)$$

Figure 7D:
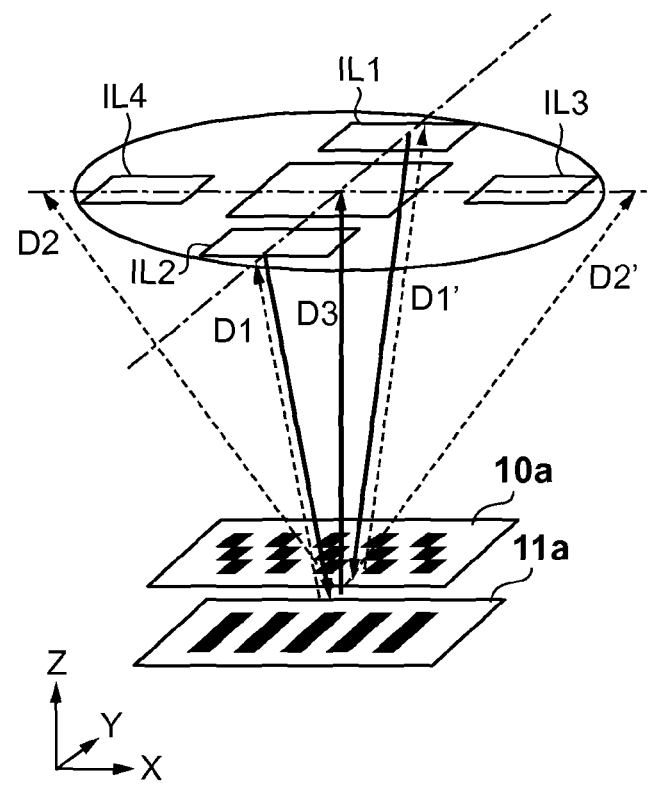

Light components not diffracted in the X-axis direction by the grating patterns 10a and 11a (the 0th-order diffracted light components, that is, the D1 and D1' shown in FIG. 7B) exit at an angle to be detected by the detection optical system 21 with respect to the X-axis. (Totally 0th-order) diffracted light components D5 and D5' not diffracted by the grating pattern 11a but diffracted by the +/−nth order and −/+nth order in the X-axis direction by the grating pattern 10a before and after being reflected by the substrate 8 also exit at an angle to be detected by the detection optical system 21 with respect to the X-axis. The diffracted light components D5 and D5' do not generate moire fringes but decrease the contrast of moire fringes. Since the grating pattern 10a is a checkered grating pattern, however, the phases of the diffracted light components D5 and D5' from adjacent gratings shift from each other by π and cancel each other. Accordingly, the intensity of the diffracted light components D5 and D5' is suppressed, so high-contrast moire fringes can be detected. FIG. 7D is a view three-dimensionally representing FIGS. 7A and 7B. FIG. 7D does not show the diffracted light components D5 and D5' because the intensity is suppressed.

Figure 8A:
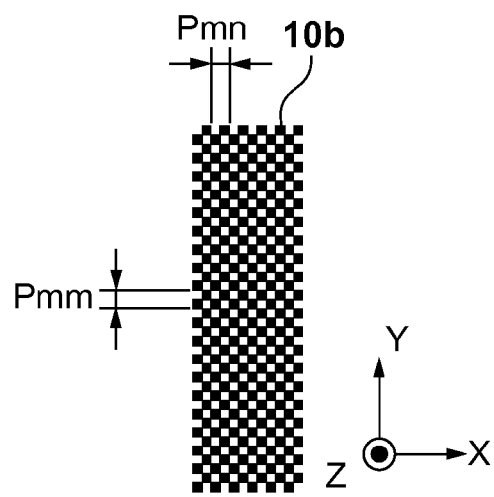
FIGS. 8A and 8B are views showing examples of a grating pattern for generating moire fringes.
Figure 8B:
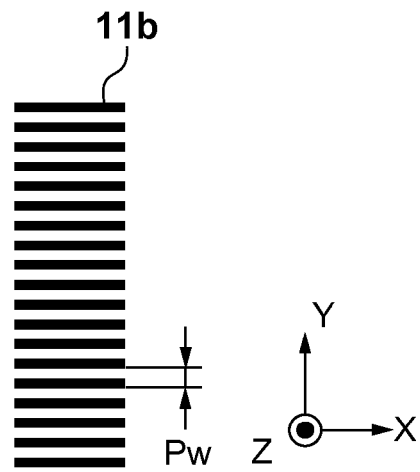

The detection of the moire fringes for obtaining the relative positions of the mold 7 and substrate 8 in the X-axis direction has been explained above. However, the detection of the moire fringes for obtaining the relative positions of the mold 7 and substrate 8 in the Y-axis direction is basically the same except that the grating pattern illumination directions are switched between the X- and Y-axes. More specifically, as shown in FIG. 8A, a checkered grating pattern 10b having the grating pitch $P_{mn}$ in the X-axis direction and the grating pitch $P_{mm}$ in the Y-axis direction is used as the mark 10 arranged on the mold 7. Also, as shown in FIG. 8B, a grating pattern 11b having the grating pitch $P_w$ different from the $P_{mm}$ in only the Y-axis direction is used as the mark 11 arranged on the substrate 8. Furthermore, the moire fringes for obtaining the relative positions in the Y-axis direction are generated by illuminating the grating patterns 10b and 11b by the second and fourth poles IL3 and IL4 arranged on the Y-axis in the pupil plane of the illumination optical system 22.

The case in which the grating patterns 10a and 10b have the same grating pitch and the grating patterns 11a and 11b have the same grating pitch has been explained so far, but the present invention is not limited to this. For example, the grating patterns 10a and 10b may also have different grating pitches, and the grating patterns 11a and 11b may also have different grating pitches. In addition, the distances from the optical axis of the detection optical system 21 to the centers of the first and third poles IL1 and IL2 may also be different, and the distances from the optical axis of the detection optical system 21 to the centers of the second and fourth poles IL3 and IL4 may also be different.

To detect one moire fringe pattern, the detection system 3 obliquely illuminates an alignment mark along two directions, and detects light vertically reflected by the mark. Accordingly, the detection system 3 can ensure a light amount twice that when an alignment mark is obliquely illuminated along only one direction and light vertically reflected by the mark is detected. Consequently, the detection system 3 can accurately detect the relative positions of the mold 7 and substrate 8. The detection system 3 can detect diffracted light having the wavelength λ within the range meeting equation (7) as described previously, and this wavelength range is preferably made as broad as possible.

Also, the mark 11 arranged on the substrate 8 is rarely exposed to the surface of the substrate 8, and is often positioned inside a process in which a few to a few ten layers are stacked. When a layer made of a transparent material is formed on the mark 11, the intensity of light from the mark 11 largely decreases due to thin-film interference depending on the wavelength λ at which the mark 11 is illuminated. However, the intensity of light from the mark 11 can be maintained outside the conditions of thin-film interference by changing the wavelength λ of light for illuminating the mark 11. Accordingly, it is desirable to make the wavelength λ of light from the light source 23 variable within a broad range in the detection system 3 as well, and set conditions under which the mark 11 can be detected in accordance with the process of the substrate 8. The conditions herein mentioned include, for example, the grating pitch of the mark 11, the numerical aperture $NA_o$, the central positions of the first and second poles, and the wavelength range and central wavelength of the light for illuminating the mark 11. As the wavelength λ of the light for illuminating the mark 11, it is possible to extract a predetermined wavelength band by a bandpass filter or the like by using a light source having a wideband wavelength such as a halogen lamp as the light source 23, or to switch a plurality of monochromatic light sources such as LEDs having different central wavelengths.

Figure 9:
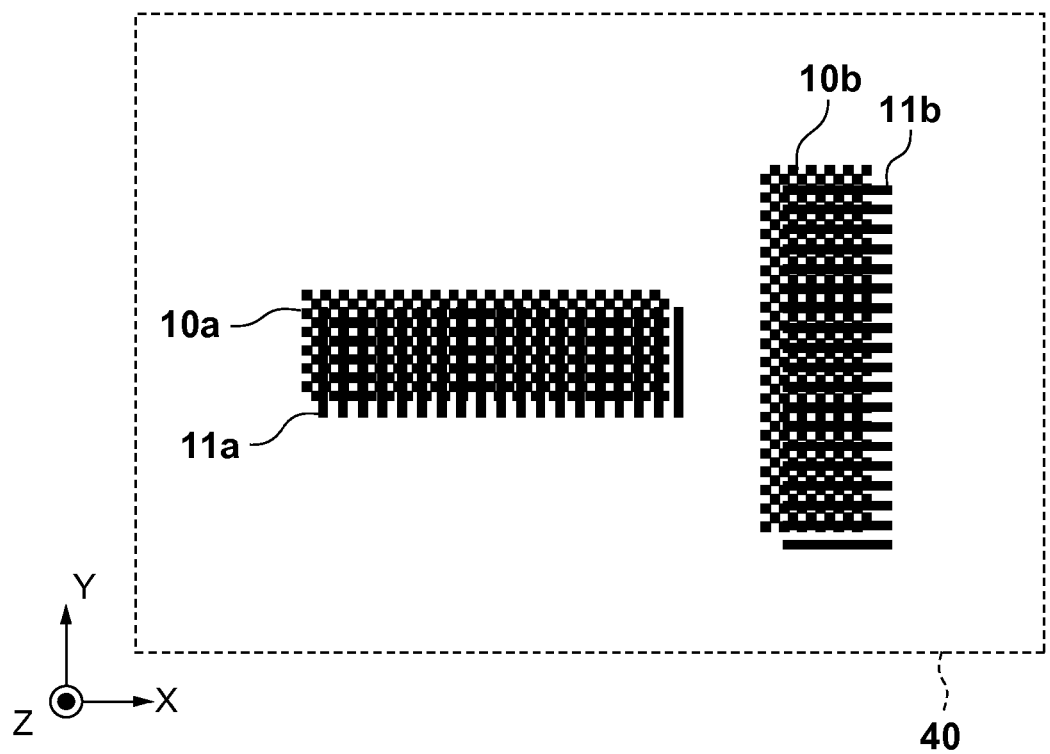
FIG. 9 is a view showing examples of a grating pattern for generating a moire pattern.

In a state in which the grating patterns 10a and 11a are overlaid on each other and the grating patterns 10b and 11b are overlaid on each other as shown in FIG. 9, these grating patterns are illuminated by the effective light source including the first, second, third, and fourth poles IL1, IL3, IL2, and IL4 as shown in FIG. 4. Then, the grating patterns are placed in a field 40 of view of the detection system 3 having the detection aperture DET. Consequently, one detection system 3 can simultaneously detect moire fringe patterns for alignment in the X- and Y-axis directions. In other words, the detection system 3 (the detection optical system 21 and illumination optical system 22) can simultaneously detect pieces of relative position information in the two directions with a relatively inexpensive simple arrangement.

<First Embodiment>

The basic configuration of the imprint apparatus 1 has been explained with reference to FIG. 1. In the imprint apparatus 1, however, mechanical interference may occur between the irradiation unit 2, detection system 3, and mold holding unit 4. As an arrangement which avoids this mechanical interference, an imprint apparatus 20 will be explained with reference to FIG. 10. The imprint apparatus 20 includes an imaging optical system 13, dichroic mirrors 14, and a reference mark 15 in addition to the arrangement of the imprint apparatus 1.

The imaging optical system 13 projects (forms an image of) moire fringes generated by a mark 10 arranged on a mold 7 and a mark 11 arranged on a substrate 8, on a projection surface 16. A detection system 3 optically detects the moire fringes projected on the projection surface 16, thereby detecting the relative positions of the mold 7 and substrate 8. An irradiation unit 2 irradiates a resin 9 on the substrate 8 with ultraviolet light via a portion (optical element) of the imaging optical system 13 and the mold 7. The dichroic mirrors 14 are used to synthesize the irradiation unit 2 and detection system 3. The imprint apparatus 20 uses the dichroic mirrors 14 because the wavelength of light (ultraviolet light) from the irradiation unit 2 and the wavelength of light from the detection system 3 are different. However, the dichroic mirrors 14 may also be replaced with half mirrors or the like. In the imprint apparatus 20, mechanical interference between the irradiation unit 2, the detection system 3, and a mold holding unit 4 can be avoided. Also, in the imprint apparatus 20, it is possible to irradiate the resin 9 with the ultraviolet light and detect the relative positions of the mold 7 and substrate 8 at the same time. Therefore, the detection system 3 need not be retracted after the relative positions of the mold 7 and substrate 8 are detected, so the productivity can be increased. The reference mark 15 includes a mark to be used in the whole imprint apparatus 20, for example, includes a mark detectable by the detection system 3.

The detection system 3 detects the relative positions of the mold 7 and substrate 8 by detecting the moire fringes via the imaging optical system 13. However, an alignment error occurs depending on the residual aberrations of the detection system 3 (a detection optical system 21 and illumination optical system 22) and the imaging optical system 13. To reduce this alignment error, the aberrations of the detection system 3 and imaging optical system 13 must be reduced. For example, the imaging optical system 13 must ensure an aberration in one shot region (imprint region), but the aberration is difficult to ensure because the angle of view of the imaging optical system 13 is larger than that of the detection system 3. In the imprint apparatus 20, an interferometer may be used to measure the aberrations of the detection system 3 and imaging optical system 13. However, this increases the apparatus cost, and increases the apparatus size in order to secure the installation space of the interferometer. When assembling the detection system 3 and imaging optical system 13, it is possible to ensure the aberrations of the individual systems. However, if it is impossible to measure the aberrations of the detection system 3 and imaging optical system 13 in the imprint apparatus 20, it is impossible to measure changes in aberrations after the detection system 3 and imaging optical system 13 are attached to the imprint apparatus 20. Also, if an alignment error occurs, it is impossible to determine whether the alignment error is caused by the aberration of the detection system 3 or imaging optical system 13.

Accordingly, this embodiment makes it possible to accurately obtain the asymmetry of an image in the detection system 3 or imaging optical system 13 in the imprint apparatus 20. In this case, a controller 12 functions as a processor which obtains the asymmetry of an image in the detection system 3 or imaging optical system 13 based on the detection result from the detection system 3.

Figure 11A:
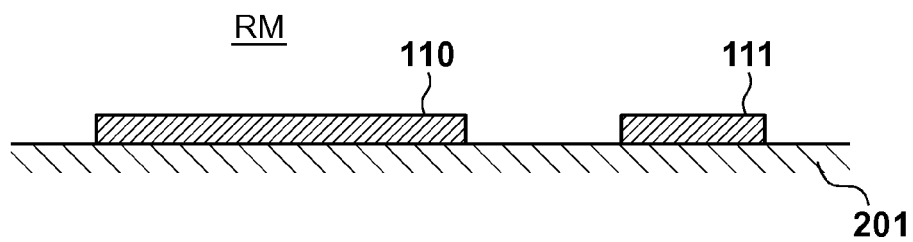
FIGS. 11A to 11C are views for explaining the detection of the asymmetry of an image by a bright-field detection system.

A method of obtaining the asymmetry of an image by using a reference mark RM as shown in FIG. 11A in an exposure apparatus including a bright-field detection system is known. FIG. 11A is a view showing the arrangement of the reference mark RM. The reference mark RM includes a first mark formed by a mark element 110, and a second mark formed by a mark element 111 having a line width (a width in a measurement direction) different from that of the mark element 110. In this embodiment, the mark elements 110 and 111 are steps formed on a substrate 201, and the mark elements 110 and 111 and substrate 201 are made of Si. However, the material of the mark elements 110 and 111 and substrate 201 is not limited to Si, and may also be $SiO_2$. It is also possible to use glass as the material of the substrate 201, and Cr as the material of the mark elements 110 and 111.

Figure 11B:
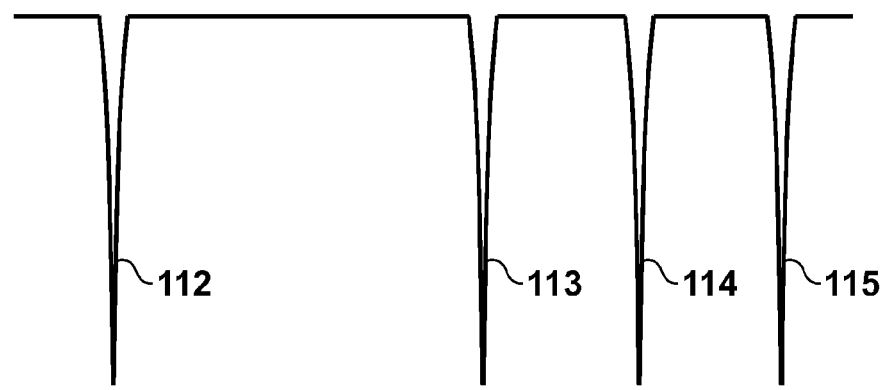
Figure 11C:
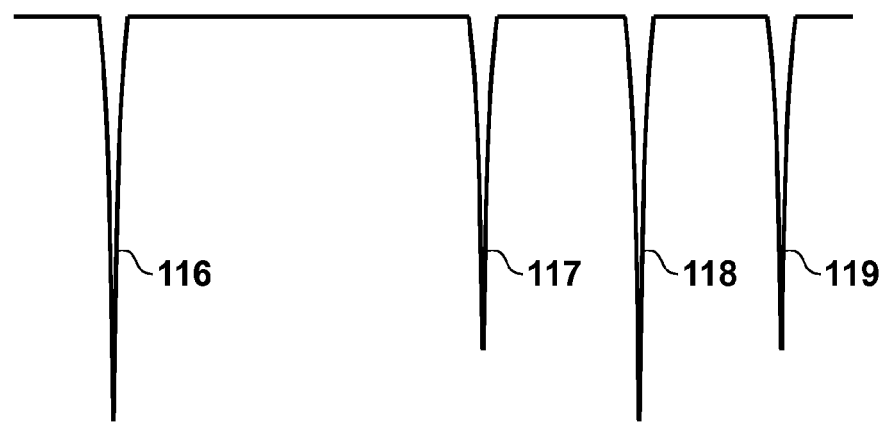

FIG. 11B shows a result (detected waveform) obtained when the mark elements 110 and 111 are detected by an ideal (that is, aberration-free) bright-field detection system. In this detected waveform shown in FIG. 11B, a waveform corresponding to the mark element 110 includes waveforms 112 and 113 corresponding to the edges, and a waveform corresponding to the mark element 111 includes waveforms 114 and 115 corresponding to the edges. The edges of the mark elements 110 and 111 generate scattered light, so the amount of light to be detected by the bright-field detection system reduces. Accordingly, the detected waveform shown in FIG. 11B is obtained. If a coma aberration exists in the bright-field detection system, however, the waveform shown in FIG. 11B is distorted, and a detected waveform shown in FIG. 11C is obtained. In this detected waveform shown in FIG. 11C, a waveform corresponding to the mark element 110 includes waveforms 116 and 117 corresponding to the edges, and a waveform corresponding to the mark element 111 includes waveforms 118 and 119 corresponding to the edges. In the detected waveform shown in FIG. 11C, the light amount ratio (peak light amount ratio) to be detected on each edge of the mark elements 110 and 111 changes from that of the detected waveform shown in FIG. 11B. The coma aberration of the bright-field detection system is obtained from this light amount ratio.

Figure 12A:
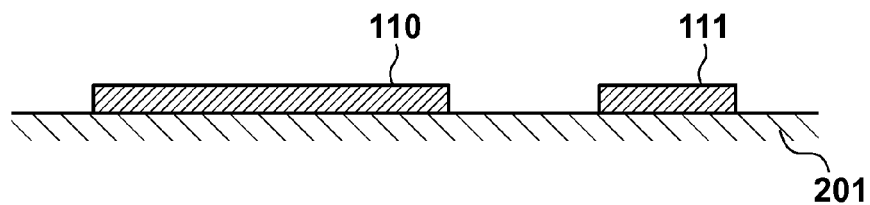
FIGS. 12A to 12C are views for explaining the detection of the asymmetry of an image by a dark-field detection system.
Figure 12B:
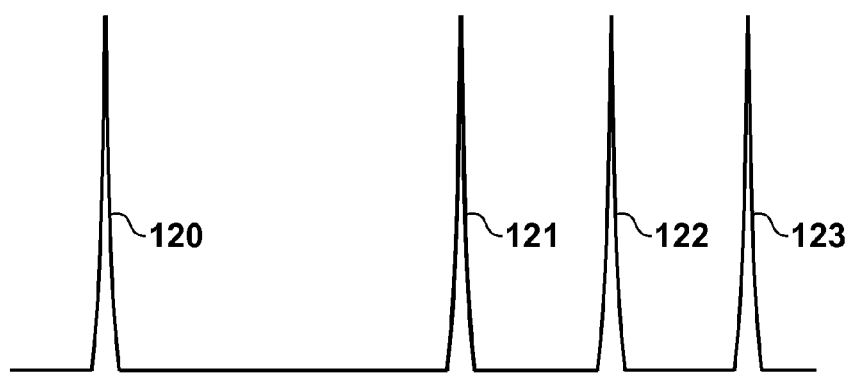
Figure 12C:
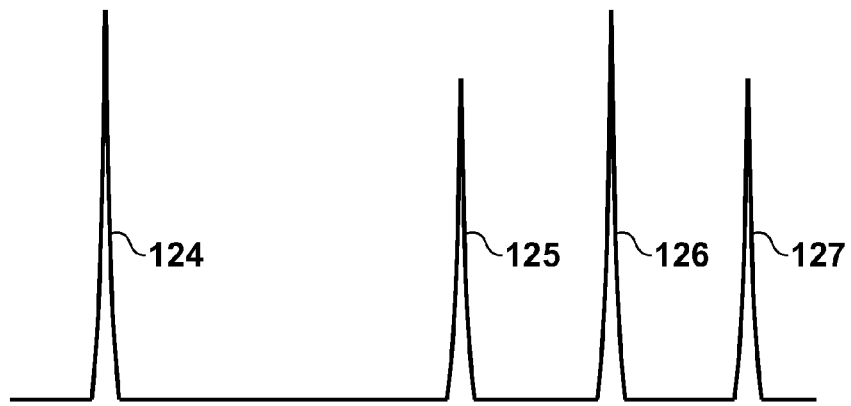

FIG. 12B shows a result (detected waveform) obtained when a reference mark RM shown in FIG. 12A is detected by an ideal dark-field detection system. The reference mark RM shown in FIG. 12A is the same as the reference mark RM shown in FIG. 11A. Unlike the bright-field detection system, the dark-field detection system detects the scattered light on each edge of mark elements 110 and 111. In the detected waveform shown in FIG. 12B, a waveform corresponding to the mark element 110 includes waveforms (peaks) 120 and 121 corresponding to the edges, and a waveform corresponding to the mark element 111 includes waveforms (peaks) 122 and 123 corresponding to the edges. Also, if a coma aberration exists in the dark-field detection system, a detected waveform shown in FIG. 12C is obtained. In this detected waveform shown in FIG. 12C, a waveform corresponding to the mark element 110 includes waveforms (peaks) 124 and 125 corresponding to the edges, and a waveform corresponding to the mark element 111 includes waveforms (peaks) 126 and 127 corresponding to the edges. If a coma aberration exists in the dark-field detection system, the light amount ratio (peak light amount ratio) to be detected on each edge of the mark elements 110 and 111 changes, as in the bright-field detection system. As described above, therefore, it is possible to obtain the coma aberration of the dark-field detection system from this light amount ratio. In this case, however, the coma aberration detection accuracy is low. For example, only a light amount ratio change of about 1% to 2% can be obtained with respect to a coma aberration of a few hundred mλ, although this more or less changes in accordance with the conditions of the dark-field detection system. Since the dark-field detection system detects scattered light and diffracted light, the detected light amount is smaller than that in the bright-field detection system. Consequently, the ratio of an error caused by electrical noise of a sensor such as an image sensor also increases. Accordingly, the above-described method cannot accurately obtain the coma aberration of the dark-field detection system.

As shown in FIGS. 13A to 13D, therefore, this embodiment uses, as the reference mark 15, a mark including a mark element having a line width equal to or smaller than the resolving power of the detection optical system 21, or a mark including a plurality of mark elements arranged at a pitch equal to or smaller than the resolving power of the detection optical system 21. As a consequence, even the dark-field detection system can accurately obtain the asymmetry of an image.

Figures 13A, 13B, 13C, 13D:
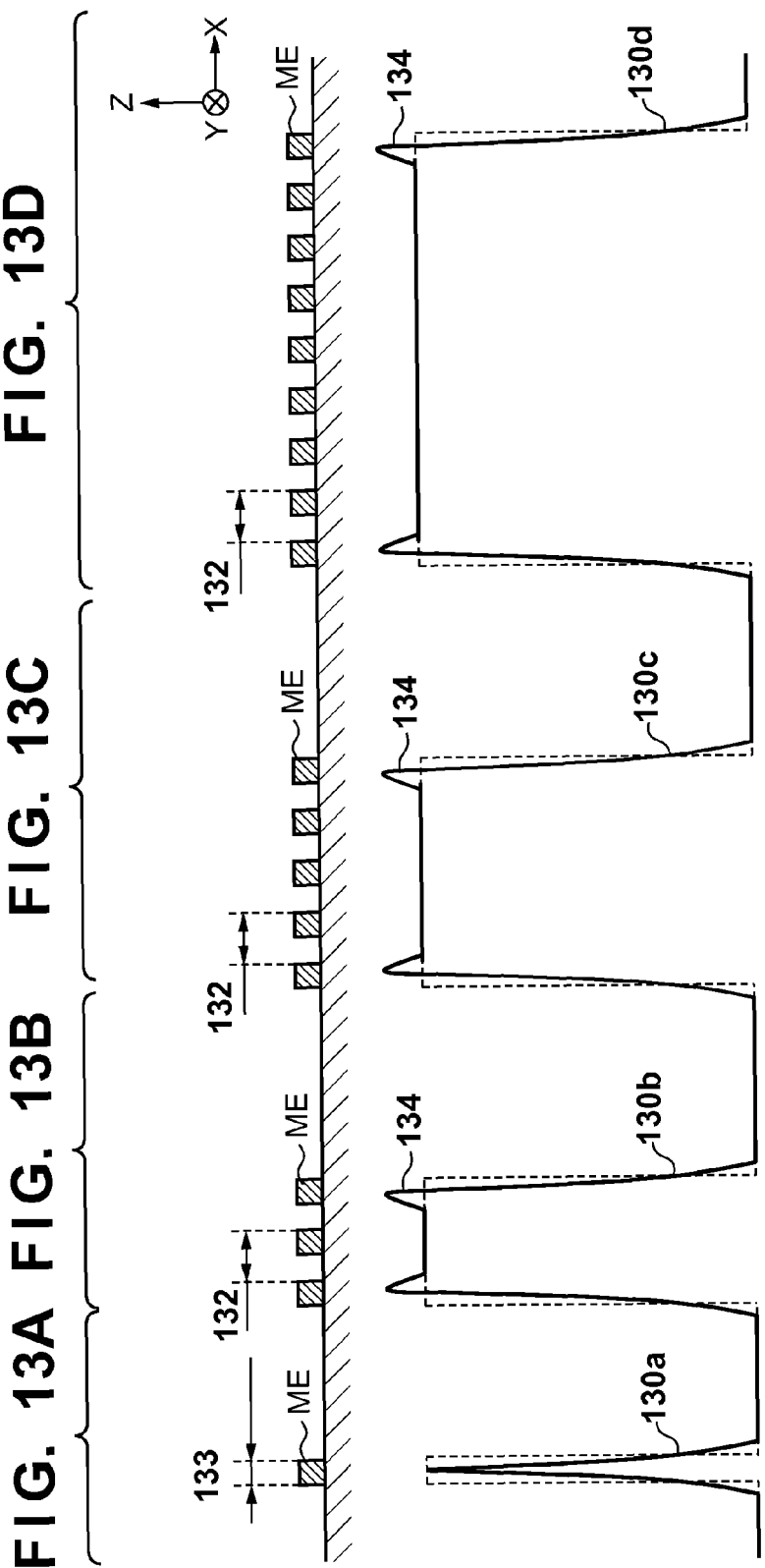
FIGS. 13A to 13D are views each showing a reference mark, and a result (detected waveform) obtained when the reference mark is detected by the detection system.

FIGS. 13A to 13D are views each showing the reference mark 15, and a result (detected waveform) obtained when the reference mark 15 is detected by the detection system 3. FIG. 13A shows the reference mark 15 including one mark element ME in the X-axis direction (the measurement direction, the first direction) as the measurement direction, and a result (detected waveform) obtained when the reference mark 15 is detected by the detection system 3. FIG. 13B shows the reference mark 15 including a mark (first mark) having three mark elements ME periodically arranged in the X-axis direction, and a result (detected waveform) obtained when the reference mark 15 is detected by the detection system 3. FIG. 13C shows the reference mark 15 including a mark having five mark elements ME periodically arranged in the X-axis direction, and a result (detected waveform) obtained when the reference mark 15 is detected by the detection system 3. FIG. 13D shows the reference mark 15 including a mark having nine mark elements ME periodically arranged in the X-axis direction, and a result (detected waveform) obtained when the reference mark 15 is detected by the detection system 3.

In the reference marks 15 shown in FIGS. 13B to 13D, the mark elements ME have a pitch 132 equal to or smaller than the resolving power of the detection system 3 (the detection optical system 21). In this embodiment, therefore, letting λ be the wavelength of light from the illumination optical system 22, NA be the numerical aperture of the detection system 3 (the detection optical system 21), and Pmax (Pmax1, Pmax3) be a maximum pitch of the pitch 132, inequality (13) below is satisfied:

$$P\text{max} < \lambda/NA \quad (13)$$

Also, in the reference mark 15 shown in FIG. 13A, the mark element ME has a line width 133 equal to or smaller than the resolving power of the detection system 3 (the detection optical system 21). It is obvious that the line width 133 of the mark element ME <the pitch 132 of the mark element ME. Accordingly, letting Wmax (Wmax1) be a maximum line width of the mark element ME, inequality (14) below is satisfied:

$$W\text{max} < P\text{max} < \lambda/NA \quad (14)$$

Furthermore, the detection system 3 performs dark-field illumination on the reference mark 15, and the pitch of the mark elements ME is set such that the detection system 3 can detect the ±1st-order diffracted light of the light illuminating the reference mark 15. This makes it possible to detect the diffracted light instead of the scattered light from the edge of the mark element ME, so the amount of light to be detected by the detection system 3 increases. For example, let λ be the wavelength of light from the illumination optical system 22, $NA_{pa}$ be the size of the pole included in the effective light source in the incidence direction, $NA_{il}$ be the incident angle, $NA_O$ be the numerical aperture of a detection aperture DET, P be the pitch 132 of the mark elements ME, and n be the diffraction order. In this case, it is possible to increase the light amount in the detection system 3 and increase the detection accuracy when the pitch 132 of the mark elements 132 satisfies:

$$n\lambda/(NA_{il} - NA_{pa}/2 + NA_O) < P < n\lambda/(NA_{il} + NA_{pa}/2 - NA_O) \quad (15)$$

The diffraction order is n in this embodiment, and n=1 by which the light amount in the detection system 3 is maximum is favorable. By setting the pitch 132 of the mark elements ME so as to satisfy inequalities (14) and (15), even the detection system 3 as a dark-field detection system can accurately obtain the asymmetry of an image. The following explanation will be made by assuming that the reference mark 15 including the mark having the plurality of mark elements ME satisfy inequalities (13) and (15), and the reference mark 15 including one mark element ME satisfies inequality (14).

In the detected waveforms of the reference marks 15 shown in FIGS. 13A to 13D, a waveform corresponding to the reference mark 15 shown in FIG. 13A is a waveform 130a, a waveform corresponding to the reference mark 15 shown in FIG. 13B is a waveform 130b, a waveform corresponding to the reference mark 15 shown in FIG. 13C is a waveform 130c, and a waveform corresponding to the reference mark 15 shown in FIG. 13D is a waveform 130d. Since the pitch 132 of the mark elements ME is equal to or smaller than the resolving power of the detection system 3, as shown in FIGS. 13B to 13D, light amounts are detected not only on the edges but also between the edges of the mark elements ME in the waveforms 130b to 130d. The amount of scattered light increases on the edges of two mark elements ME arranged at the two ends in the X-axis direction, so corresponding peaks 134 appear in the waveforms 130b to 130d.

Figure 14A:
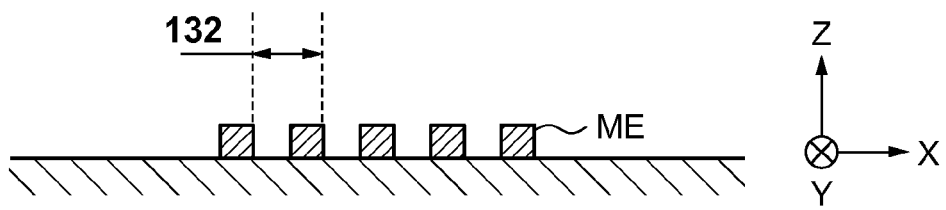
FIGS. 14A to 14D are views showing a reference mark, and results (detected waveforms) obtained when the reference mark is detected by the detection system.
Figure 14B:
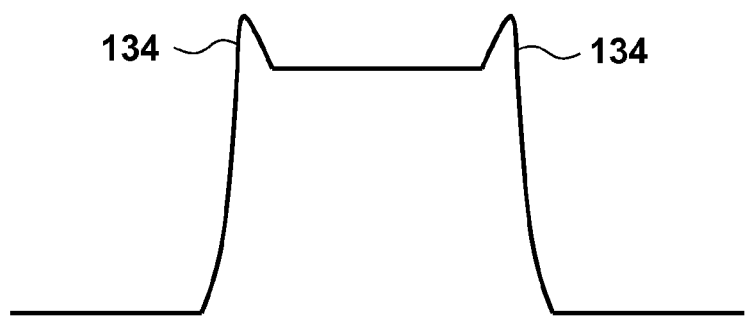
Figure 14C:
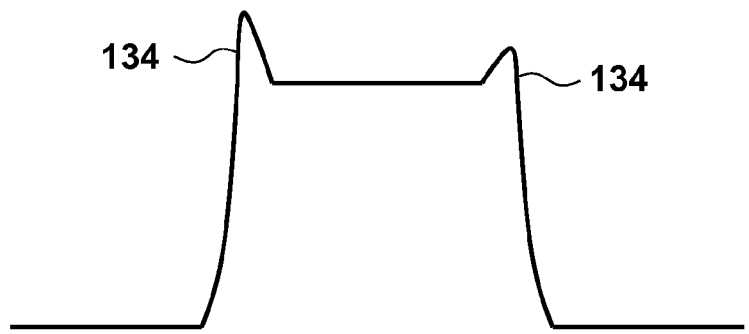
Figure 14D:
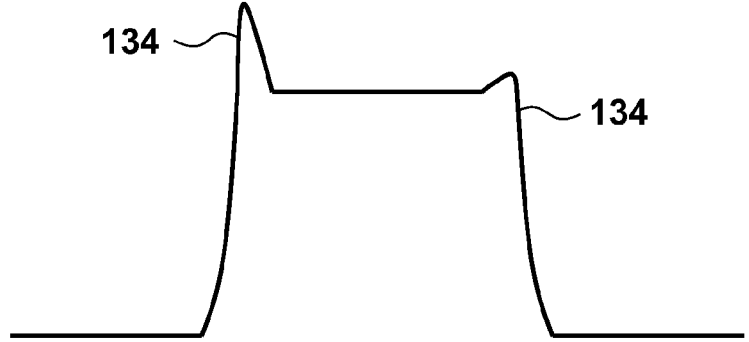

The detected waveform obtained when the reference mark 15 shown in FIG. 13C is detected by the detection system 3 will be explained in detail below with reference to FIGS. 14A to 14D. A reference mark 15 shown in FIG. 14A is the same as the reference mark 15 shown in FIG. 13C. The detection system 3 performs dark-field illumination on the reference mark 15 shown in FIG. 14A via the imaging optical system 13, and detects diffracted light and scattered light from the reference mark 15 via the imaging optical system 13. When the detection system 3 and imaging optical system 13 have no coma aberration, a detected waveform shown in FIG. 14B is obtained when the reference mark 15 shown in FIG. 14A is detected. On the other hand, when the detection system 3 or imaging optical system 13 has a smaller coma aberration, a detected waveform shown in FIG. 14C is obtained when the reference mark 15 shown in FIG. 14A is detected. Also, when the detection system 3 or imaging optical system 13 has a large coma aberration, a detected waveform shown in FIG. 14D is obtained when the reference mark 15 shown in FIG. 14A is detected. Note that FIGS. 14B to 14D illustrate models of the detected waveforms obtained by performing dark-field illumination on the reference mark 15 shown in FIG. 14A, so actual detected waveforms change more complicatedly. If the residual aberration in the detection system 3 or imaging optical system 13 increases, the asymmetry of the detected waveform increases near the peaks 134 as shown in each of FIGS. 14B to 14D. By calculating the shifts of the detected waveforms shown in FIGS. 14B to 14D, it is possible to obtain the amount of coma aberration in the detection system 3 or imaging optical system 13.

Figure 15:
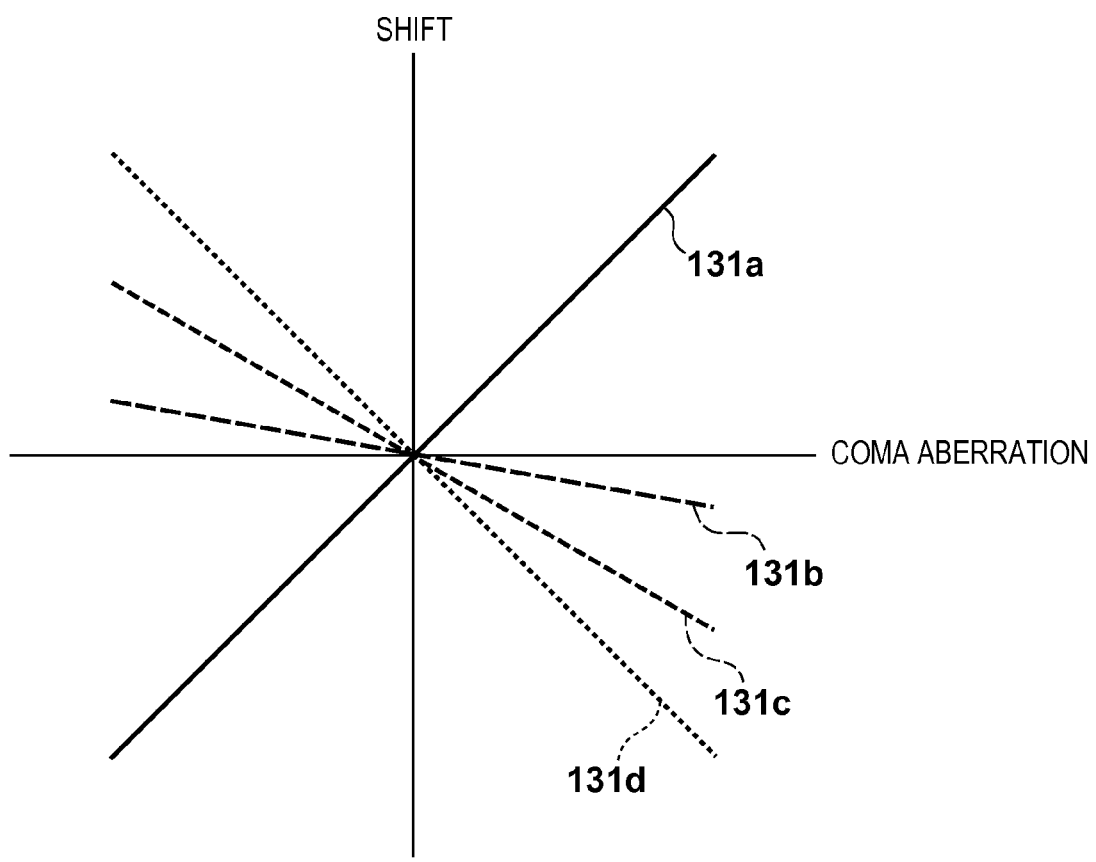
FIG. 15 is a view showing the relationship between a position shift of the detected waveform of a reference mark and the coma aberration of the detection system or an imaging optical system.

FIG. 15 is a view showing the relationship between the shifts of the detected waveforms of the reference marks 15 shown in FIGS. 13A to 13D and the coma aberration in the detection system 3 or imaging optical system 13. Referring to FIG. 15, the amount of coma aberration when the detection system 3 or imaging optical system 13 has the coma aberration is plotted on the abscissa, and the shift of the detected waveform is plotted on the ordinate. The waveforms 130a to 130d shown in FIGS. 13A to 13D respectively correspond to 131a to 131d shown in FIG. 15. As shown in FIG. 15, it is possible to linearly express the shift of the detected waveform with respect to the coma aberration in the detection system 3 or imaging optical system 13. Also, the sensitivity of the shift of the detected waveform with respect to the coma aberration in the detection system 3 or imaging optical system 13 changes in accordance with the number of mark elements ME forming the reference mark 15. The sign of the sensitivity of the reference mark 15 including one mark element ME differs from that of the sensitivity of the reference mark 15 including a plurality of mark elements ME. When the reference mark 15 includes a plurality of mark elements ME, the sensitivity increases as the number of mark elements ME increases. However, the sensitivity saturates at a given value when the number of mark elements ME forming the reference mark 15 is increased.

Figure 16A:
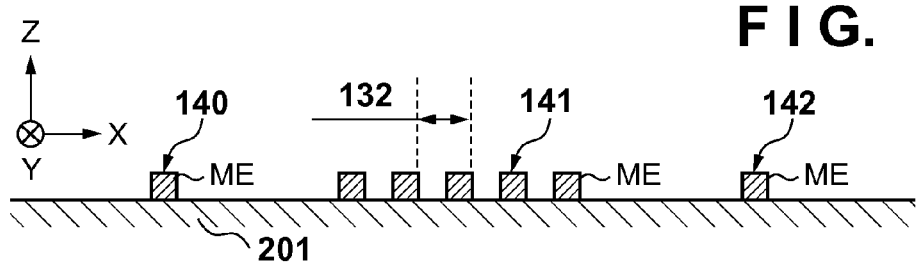
FIGS. 16A and 16B are views showing a reference mark, and a result (detected waveform) obtained when the reference mark is detected by the detection system.
Figure 16B:
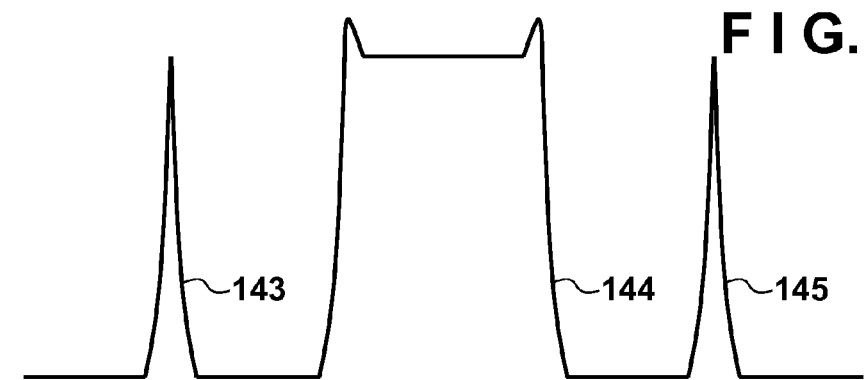

The asymmetry of an image can accurately be obtained by detecting a reference mark 15 shown in FIG. 16A by the detection system 3 by using the characteristic as described above. The reference mark 15 shown in FIG. 16A includes a mark 140 (a second mark) having one mark element ME, a mark (first mark) 141 having five mark elements ME, and a mark 142 having one mark element. When the reference mark 15 shown in FIG. 16A is detected by the detection system 3, as shown in FIG. 16B, a detected waveform 143 is obtained from the mark 140, a detected waveform 144 is obtained from the mark 141, and a detected waveform 145 is obtained from the mark 142. As explained with reference to FIG. 15, if a coma aberration exists in the detection system 3 or imaging optical system 13, a shift of the detected waveform occurs. As described above, the sign of the sensitivity to the coma aberration of the mark 141 differs from that of the marks 140 and 142. Accordingly, by obtaining the difference between the average value of the shifts of the detected waveforms 143 and 145 and the shift of the detected waveform 144, the sensitivity of the shift of the detected waveform with respect to the coma aberration increases, and this makes it possible to accurately obtain the asymmetry of an image.

Figure 17A:
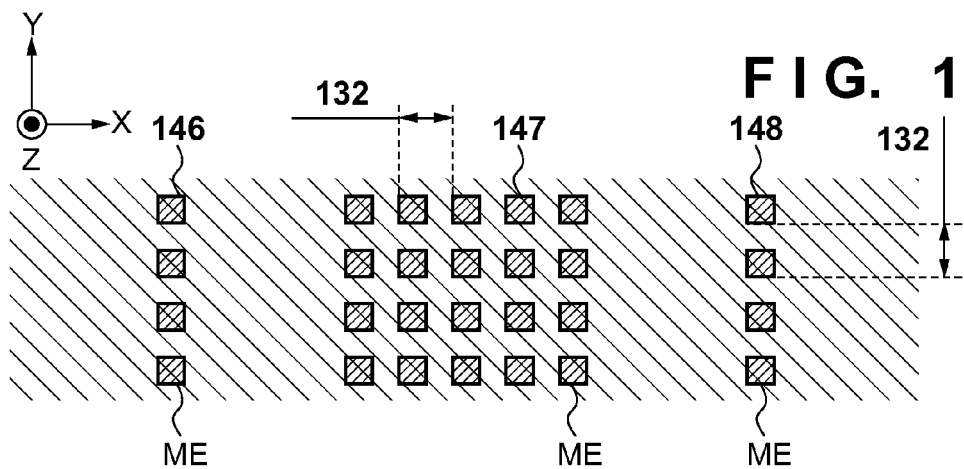
FIGS. 17A and 17B are views showing a reference mark, and a result (detected waveform) obtained when the reference mark is detected by the detection system.
Figure 17B:
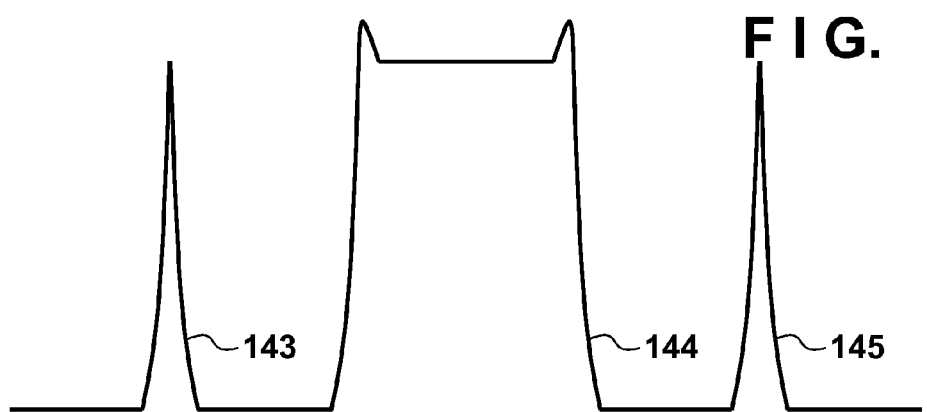

In the reference mark 15 shown in FIG. 16A, the mark elements ME are arranged in the image asymmetry measurement direction. However, the mark elements ME can be arranged not only in the measurement direction but also in the Y-axis direction (second direction) as a non-measurement direction perpendicular to the measurement direction. In a reference mark 15 shown in FIG. 17A, a plurality of mark elements ME are arranged in the measurement direction and non-measurement direction so as to satisfy inequalities (14) and (15). In other words, letting Pmax1' be a maximum pitch of the plurality of mark elements ME in the non-measurement direction, Pmax1'<$\lambda$/NA is satisfied. Also, letting Wmax1' be a maximum line width of the mark element ME in the non-measurement direction, Wmax1'<$\lambda$/NA is satisfied. In FIG. 17A, the X-axis direction is the measurement direction, and the Y-axis direction is the non-measurement direction. In marks 146 and 148, one mark element ME is arranged in the measurement direction, and four mark elements ME are arranged in the non-measurement direction. In a mark 147, five mark elements ME are arranged in the measurement direction, and four mark elements ME are arranged in the non-measurement direction. Under the dark-field illumination conditions shown in FIG. 4, the second and fourth poles IL3 and IL4 have an incident angle in the measurement direction, and the first and third poles IL1 and IL2 have an incident angle in the non-measurement direction. In the reference mark 15 shown in FIG. 16A, no mark elements ME are arranged in the non-measurement direction, only the scattered light of the edges of the mark elements ME can be detected for the first and third poles IL1 and IL2. On the other hand, in the reference mark 15 shown in FIG. 17A, diffracted light can be detected for the first and third poles IL1 and IL2 as well. When using the effective light source (quadrupole illumination) shown in FIG. 4, therefore, the light amount detectable by the detection system 3 can be increased. Consequently, the image asymmetry measurement accuracy also increases. When the reference mark 15 shown in FIG. 17A is detected by the detection system 3, as shown in FIG. 17B, a detected waveform 143 is obtained from the mark 146, a detected waveform 144 is obtained from the mark 147, and a detected waveform 145 is obtained from the mark 148. The detection system 3 uses a two-dimensional sensor such as a CCD or CMOS sensor as an image sensor 25, and hence can obtain a two-dimensional detected waveform. However, FIG. 17B shows a detected waveform in only the measurement direction by integrating a detected waveform in the non-measurement direction. This detected waveform obtained from the reference mark 15 shown in FIG. 17A is almost the same as that shown in FIG. 16B, so a shift of the detected waveform occurs with respect to the coma aberration in the detection system 3 or imaging optical system 13.

The reference mark 15 for accurately obtaining the asymmetry of an image caused by the coma aberration in the detection system 3 or imaging optical system 13 in the imprint apparatus 20 including the detection system 3 as a bright-field detection system has been explained so far. Next, a method of obtaining the asymmetry of an image caused by the aberration of the detection system 3 and the asymmetry of an image caused by the aberration of the imaging optical system 13 by using the reference mark 15 will be explained.

When the reference mark 15 is detected by the detection system 3 via the imaging optical system 13, the asymmetry of a total image of the detection system 3 and imaging optical system 13 is obtained. Therefore, a calibration mark is arranged on the projection surface 16 of the imaging optical system 13. This calibration mark can mechanically be arranged on the projection surface 16, and can also be arranged on the projection surface 16 when the calibration mark is used. Dark-field illumination is performed on the calibration mark arranged on the projection surface 16 by using the light from the detection system 3, and the diffracted light or scattered light is detected by the detection system 3. In this case, the asymmetry of an image is caused by the aberration of the detection system 3. Accordingly, the asymmetry of an image caused by the aberration of the imaging optical system 13 can be obtained by subtracting the asymmetry of an image obtained by using the calibration mark from the asymmetry of an image obtained by using the reference mark 15. The calibration mark is preferably the same as the reference mark 15 in order to remove an error between the marks. It is also possible to form the reference mark 15 on the substrate 8 and move the substrate stage 5, thereby arranging the reference mark 15 formed on the substrate 8 in a position where the detection system 3 can detect the mark. In this case, the weight of the substrate stage 5 can be reduced.

Figure 10:
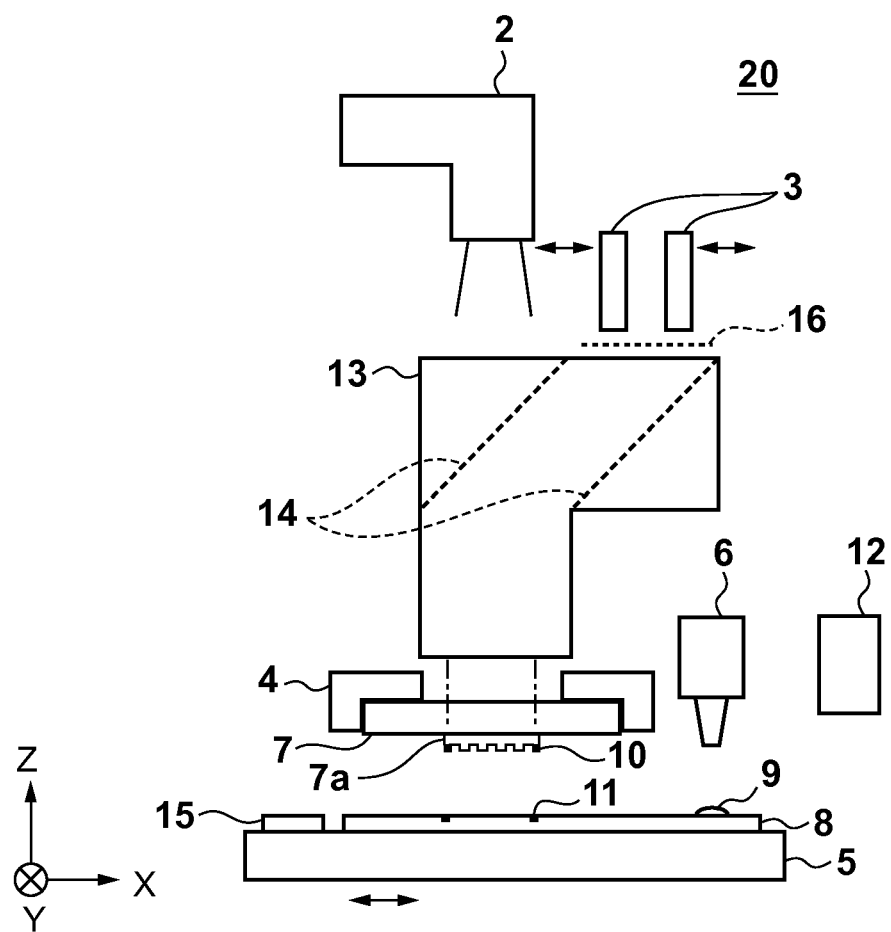
FIG. 10 is a schematic view showing the arrangement of the imprint apparatus.

The imprint apparatus 20 adopts a die-by-die method which detects a mark (alignment mark) formed in each shot region. To obtain the magnification and rotation of a shot region, therefore, the detection system 3 must detect a plurality of marks in the shot region. When the imprint apparatus 20 includes a plurality of detection systems 3 as shown in FIG. 10, the productivity can be increased because it is unnecessary to detect a plurality of marks by moving the detection system 3. Also, the imaging optical system 13 has a large angle of view, so the asymmetry of an image can be obtained at a plurality of image heights of the imaging optical system 13 by moving the detection system 3. In this case, the plurality of detection systems 3 can detect the same image height of the imaging optical system 13. Therefore, random component errors can be averaged by averaging the detection results obtained by the plurality of detection systems 3. It is also possible to output the value of each image height of the imaging optical system 13 based on values obtained by detecting the same image height, for example, a central image height of the imaging optical system 13 by the plurality of detection systems 3.

In the imprint apparatus 20, the detection system 3 or imaging optical system 13 can individually be adjusted based on the asymmetry of an image in the detection system 3 or imaging optical system 13. More specifically, the detection system 3 or imaging optical system 13 can automatically be adjusted by determining a driving amount by which a driver for driving an optical element forming the detection system 3 or imaging optical system 13 drives the optical element, based on the asymmetry of an image in the detection system 3 or imaging optical system 13. Also, in this embodiment as described previously, if an alignment error occurs, it is possible to determine whether the error is caused by the aberration of the detection system 3 or imaging optical system 13.

In this embodiment, the imprint apparatus 20 including the imaging optical system 13 has been explained. However, even the imprint apparatus 1 not including the imaging optical system 13 can obtain the asymmetry of an image in the detection system 3 by using the reference mark 15.

Furthermore, in this embodiment, the asymmetry of an image in the detection system 3 or imaging optical system 13 has been explained by taking a coma aberration as an example. However, it is also possible to obtain any component which causes the asymmetry of an image, other than the coma aberration.

In this embodiment as has been explained above, the width of the mark element ME in the X-axis direction is set such that when the detection system 3 detects light from the reference mark 15, the two edges of the mark element ME in the X-axis direction are detected as one peak. Alternatively, the pitch of a plurality of mark elements ME in the X-axis direction is set such that when the detection system 3 detects light from the reference mark 15, only two marks ME arranged at the two ends of the plurality of mark elements ME in the X-axis direction are detected as peaks. It is also possible to periodically arrange the mark elements ME in the Y-axis direction perpendicular to the X-axis direction. In this case, the pitch of a plurality of mark elements ME in the Y-axis direction is so set that when the detection system 3 detects light from the reference mark 15, only two marks ME arranged at the two ends of the plurality of mark elements ME in the Y-axis direction are detected as peaks.

In the imprint apparatus 20, therefore, it is possible to accurately obtain the coma aberration of the detection system 3 (the asymmetry in a direction perpendicular to the optical-axis direction of light from the detection optical system 21), and the coma aberration of the imaging optical system 13. This makes it possible to accurately adjust the aberrations of the detection system 3 and imaging optical system 13, and increase the productivity of a semiconductor device.

<Second Embodiment>

Figure 18A:
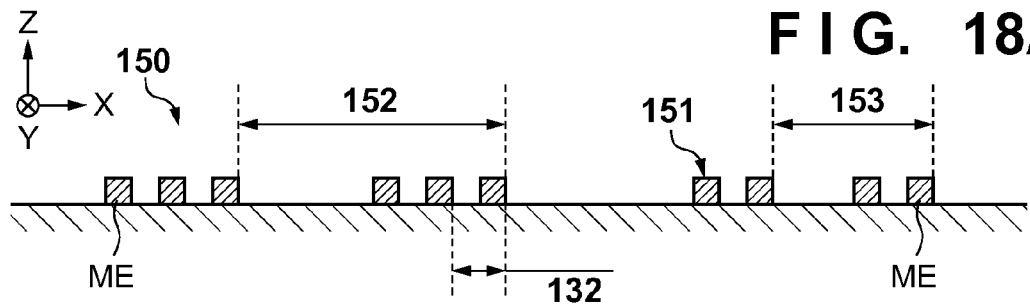
FIGS. 18A to 18D are views showing a reference mark, and results (detected waveforms) obtained when the reference mark is detected by the detection system.

In the second embodiment, a case in which the asymmetry in the optical-axis direction of an image in a detection system 3 or imaging optical system 13 is obtained by using a reference mark 15 will be explained. FIG. 18A is a view showing the reference mark 15 including a mark (first mark) 150, and a mark (third mark) 151 having two mark elements ME. In the mark 150, two sets of three mark elements ME are arranged, and a pitch 152 satisfies inequalities (13) and (15). In the mark 151, two sets of two mark elements ME are arranged, and a pitch 153 satisfies inequalities (13) and (15). The pitches 152 and 153 are different from each other, and pitch 152>pitch 153 in this embodiment.

Figure 18B:
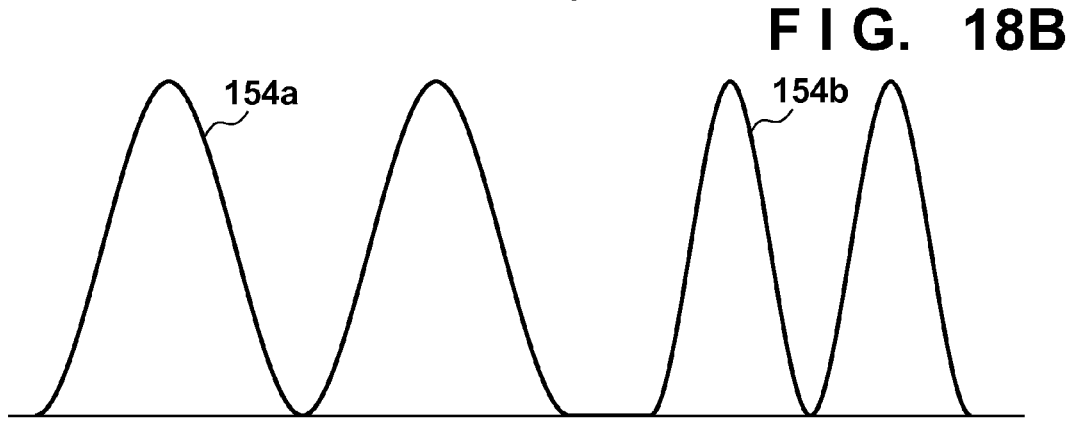
Figure 18C:
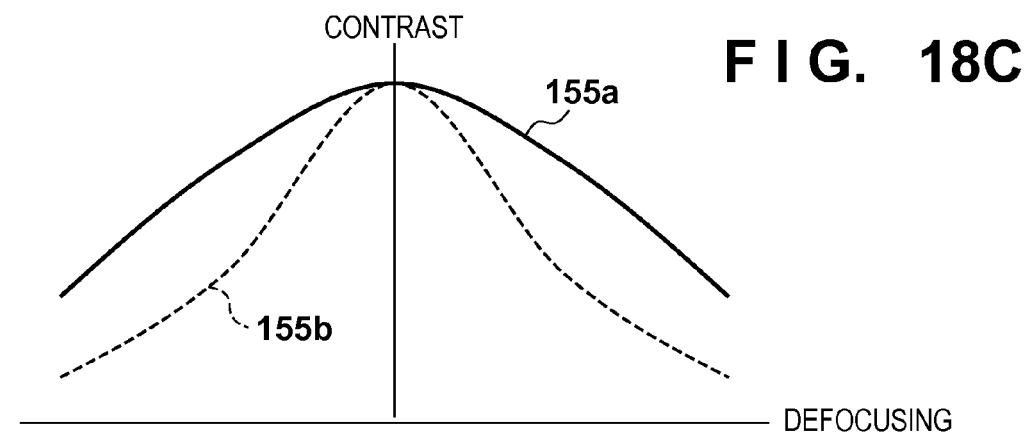
Figure 18D:
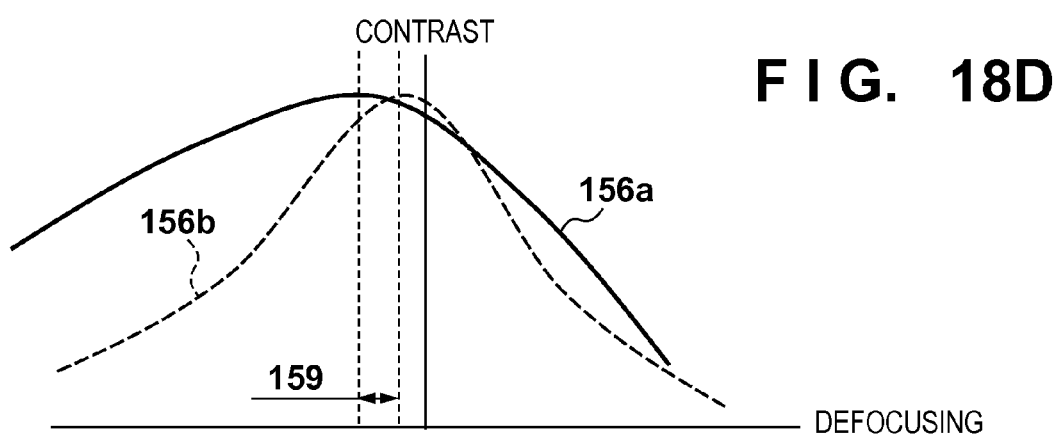

When the reference mark 15 shown in FIG. 18A is detected by the detection system 3, as shown in FIG. 18B, a detected waveform 154a is obtained from the mark 150, and a detected waveform 154b is obtained from the mark 151. Since the marks 150 and 151 are formed at the pitches equal to or smaller than the resolving power of the detection system 3, the detected waveforms shown in FIG. 18B are obtained. FIG. 18C shows changes in contrasts (contrast curves) of the detected waveforms 154a and 154b when the detection system 3 detects the reference mark 15 shown in FIG. 18A while it is defocused. Note that the reference mark 15 can be defocused by moving a substrate stage 5 in the optical-axis direction, or by driving a focusing lens (not shown) of the detection system 3. In FIG. 18C, the defocusing is plotted on the abscissa, and the contrast is plotted on the ordinate. A contrast curve 155a corresponds to the contrast change of the detected waveform 154a, and a contrast curve 155b corresponds to the contrast change of the detected waveform 154b. Since pitch 152>pitch 153, the contrast curve 155a is more moderate than the contrast curve 155b. When a spherical aberration exists in the detection system 3 or imaging optical system 13, as shown in FIG. 18D, the contrast curve 155a changes to a contrast curve 156a, and the contrast curve 155b changes to a contrast curve 156b. Referring to FIGS. 18C and 18D, the peak position of the contrast curve obviously changes due to the spherical aberration of the detection system 3 or imaging optical system 13. Since this peak position change is influenced by the pitch 152 or 153, a peak position difference is produced between the contrast curves 156a and 156b, as indicated by a difference 159 shown in FIG. 18D. The difference 159 between the peak positions of the contrast curves 156a and 156b linearly changes with respect to the spherical aberration of the detection system 3 or imaging optical system 13. Therefore, the spherical aberration of the detection system 3 or imaging optical system 13 can be obtained from the difference 159.

As described above, the asymmetry in the optical-axis direction of an image in the detection system 3 or imaging optical system 13 can be obtained by using the reference mark 15 including two marks having different pitches.

In this embodiment, the asymmetry in the optical-axis direction of an image in the detection system 3 or imaging optical system 13 has been explained by taking a spherical aberration as an example. However, it is possible to obtain any component other than the spherical aberration, provided that the component produces the asymmetry in the optical-axis direction of an image. This component includes at least one of an axial aberration, curvature of field, and astigmatism.

In this embodiment, it is possible to accurately obtain the spherical aberration of the detection system 3 (the asymmetry in the optical-axis direction of light from a detection optical system 21) and the spherical aberration of the imaging optical system 13. This makes it possible to accurately adjust the aberration of the detection system 3 or imaging optical system 13, and increase the productivity of a semiconductor device.

<Third Embodiment>

A method of manufacturing an article according to an embodiment of the present invention is suitable for manufacturing an article, for example, a microdevice such as a semiconductor device or an element having a microstructure. This manufacturing method includes a step of forming a pattern on a substrate by using the imprint apparatus 20, and a step of processing the substrate on which the pattern is formed. Following the above-mentioned formation step, the manufacturing method can also include other well-known steps (for example, oxidation, deposition, vapor deposition, doping, planarization, etching, resist removal, dicing, bonding, and packaging). The method of manufacturing an article according to this embodiment is more advantageous than any conventional methods in at least one of the performance, quality, productivity, and production cost of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-182473 filed on Sep. 3, 2013, which is hereby incorporated by reference herein in its entirety.

What is claimed is:

1. A detection apparatus for detecting a position of a detection target, comprising:
an illumination optical system configured to perform dark-field illumination on a mark; and
a detection optical system configured to guide the light from the mark to a sensor, to detect a position of the mark in a first direction,
wherein the mark includes one mark element in the first direction,
wherein a width of the mark element in the first direction is set such that two edges of the mark element in the first direction are detected as one peak when the sensor detects the light from the mark, and
wherein letting λ be a wavelength of light from the illumination optical system, NA be a numerical aperture of the detection optical system, and Wmax1 be a maximum width of the mark element in the first direction, $$W\mathrm{max}1 < \lambda/NA$$

is satisfied.

2. A detection apparatus for detecting a position of a detection target, comprising:
an illumination optical system configured to perform dark-field illumination on a mark; and
a detection optical system configured to guide the light from the mark to a sensor, to detect a position of the mark in a first direction,
wherein the mark includes a first mark having a plurality of first mark elements periodically arranged in the first direction, and
wherein a pitch of the plurality of first mark elements in the first direction is set such that only two first mark elements arranged at two ends of the plurality of first mark elements in the first direction are detected as two peaks when the sensor detects the light from the mark.

3. The apparatus according to claim 2, wherein
the mark includes a second mark having at least one second mark element in the first direction, in addition to the first mark, and
a width of the at least one second mark element in the first direction is set such that two edges of the at least one second mark element in the first direction are detected as one peak when the sensor detects the light from the mark.

4. The apparatus according to claim 3, wherein
the plurality of first mark elements are periodically arranged in a second direction perpendicular to the first direction,
a pitch of the plurality of first mark elements in the second direction is set such that only two first mark elements arranged at two ends of the plurality of first mark elements in the second direction are detected as two peaks when the sensor detects the light from the mark,
the second mark includes a plurality of second mark elements periodically arranged in the second direction, and
a pitch of the plurality of second mark elements in the second direction is set such that only two second mark elements arranged at two ends in the second direction of the plurality of second mark elements arranged in the second direction are detected as two peaks when the sensor detects the light from the mark.

5. The apparatus according to claim 4, wherein letting λ be a wavelength of light from the illumination optical system, NA be a numerical aperture of the detection optical system, Pmax1' be a maximum pitch of the first mark elements in the second direction, and Wmax1' be a maximum width of the second mark element in the second direction, $$P\mathrm{max}1' < \lambda/NA \text{ and } W\mathrm{max}1' < \lambda/NA$$

are satisfied.

6. The apparatus according to claim 4, wherein the illumination optical system performs dark-field illumination on the mark in the first direction and the second direction.

7. The apparatus according to claim 3, wherein letting λ be a wavelength of light from the illumination optical system, NA be a numerical aperture of the detection optical system, Pmax1 be a maximum pitch of the first mark elements in the first direction, and Wmax1 be a maximum width of the second mark element in the first direction, $$P\mathrm{max}1 < \lambda/NA \text{ and } W\mathrm{max}1 < \lambda/NA$$

are satisfied.

8. The apparatus according to claim 3, further comprising a processor configured to obtain a position of the first mark in the first direction and a position of the second mark in the first direction based on light from the first mark and light from the second mark detected by the sensor, and obtain asymmetry of light from the optical system in a direction perpendicular to an optical-axis direction of the optical system based on a difference between the position of the first mark in the first direction and the position of the second mark in the first direction.

9. The apparatus according to claim 2, wherein
the mark includes a third mark having a plurality of third mark elements periodically arranged in the first direction, in addition to the first mark,
a pitch of the plurality of third mark elements in the first direction is set such that only two third mark elements arranged at two ends of the plurality of third mark elements in the first direction are detected as two peaks when the sensor detects the light from the mark, and the pitch of the plurality of first mark elements in the first direction and the pitch of the plurality of third mark elements in the first direction are different.

10. The apparatus according to claim 9, wherein letting λ be a wavelength of light from the illumination optical system, NA be a numerical aperture of the detection optical system, Pmax1 be a maximum pitch of the first mark elements in the first direction, and Pmax3 be a maximum pitch of the third mark elements in the first direction, $$P\text{max}1 < \lambda/NA \text{ and } P\text{max}3 < \lambda/NA$$

are satisfied.

11. The apparatus according to claim 9, further comprising a processor configured to obtain asymmetry of light from the optical system in an optical-axis direction of the optical system, based on light from the first mark and light from the third mark detected by the sensor.

12. The apparatus according to claim 11, wherein the sensor detects the light from the first mark and the light from the third mark while defocusing the first mark and the third mark, and wherein the processor obtains the asymmetry of the light from the optical system in the optical-axis direction of the optical system based on a difference between a peak position on a contrast curve of the light from the first mark and a peak position on a contrast curve of the light from the third mark.

13. The apparatus according to claim 11, wherein the asymmetry of the light from the optical system in the optical-axis direction of the optical system includes at least one of a spherical aberration, axial aberration, curvature of field, and astigmatism of the optical system.

14. The apparatus according to claim 2, further comprising a processor configured to obtain asymmetry of light from the optical system in a direction perpendicular to an optical-axis direction of the optical system, based on the light from the mark detected by the sensor.

15. The apparatus according to claim 14, wherein asymmetry of the light from the optical system in the direction perpendicular to the optical-axis direction of the optical system includes a coma aberration of the optical system.

16. The apparatus according to claim 14, further comprising a driver configured to drive an optical element forming the optical system,
wherein the processor determines a driving amount by which the driver drives the optical element, based on the asymmetry of the light from the optical system in the direction perpendicular to the optical-axis direction of the optical system.

17. A lithography apparatus for forming a pattern on a substrate, comprising:
a stage configured to move while holding the substrate;
a detection apparatus, configured to detect a position of the substrate, wherein the detection apparatus comprises:
an illumination optical system configured to perform dark-field illumination on a mark; and
a detection optical system configured to guide the light from the mark to a sensor, to detect a position of the mark in a first direction,
wherein the mark includes one mark element in the first direction,
wherein a width of the mark element in the first direction is set such that two edges of the mark element in the first direction are detected as one peak when the sensor detects the light from the mark, and
wherein letting λ be a wavelength of light from the illumination optical system, NA be a numerical aperture of the detection optical system, and Wmax1 be a maximum width of the mark element in the first direction, $$W\text{max}1 < \lambda/NA$$

is satisfied.
a controller configured to control the stage based on the position of the substrate detected by the detection apparatus.

18. A lithography apparatus for forming a pattern on a substrate, comprising:
a stage configured to move while holding the substrate;
a detection apparatus, configured to detect a position of the substrate, wherein the detection apparatus comprises:
an illumination optical system configured to perform dark-field illumination on a mark; and
a detection optical system configured to guide the light from the mark to a sensor, to detect a position of the mark in a first direction,
wherein the mark includes a first mark having a plurality of first mark elements periodically arranged in the first direction, and
wherein a pitch of the plurality of first mark elements in the first direction is set such that only two first mark elements arranged at two ends of the plurality of first mark elements in the first direction are detected as two peaks when the sensor detects the light from the mark; and
a controller configured to control the stage based on the position of the substrate detected by the detection apparatus.

19. A method of manufacturing an article, the method comprising:
forming a pattern on a substrate using a lithography apparatus; and
processing the substrate on which the pattern has been transferred,
wherein the lithography apparatus includes:
a stage configured to move while holding the substrate;
a detection apparatus configured to detect a position of the substrate; and
a controller configured to control the stage based on the position of the substrate detected by the detection apparatus, and
wherein the detection apparatus includes:
an illumination optical system configured to perform dark-field illumination on a mark; and
a detection optical system configured to guide the light from the mark to a sensor, to detect a position of the mark in a first direction,
wherein the mark includes one mark element in the first direction,
wherein a width of the mark element in the first direction is set such that two edges of the mark element in the first direction are detected as one peak when the sensor detects the light from the mark, and
wherein letting λ be a wavelength of light from the illumination optical system, NA be a numerical aperture of the detection optical system, and Wmax1 be a maximum width of the mark element in the first direction, $$W\text{max}1 < \lambda/NA$$

is satisfied.

20. A method of manufacturing an article, the method comprising:

forming a pattern on a substrate using a lithography apparatus; and processing the substrate on which the pattern has been transferred, wherein the lithography apparatus includes:
- a stage configured to move while holding the substrate;
- a detection apparatus configured to detect a position of the substrate; and
- a controller configured to control the stage based on the position of the substrate detected by the detection apparatus, and wherein the detection apparatus includes:
- an illumination optical system configured to perform dark-field illumination on a mark; and
- a detection optical system configured to guide the light from the mark to a sensor, to detect a position of the mark in a first direction, wherein the mark includes a first mark having a plurality of first mark elements periodically arranged in the first direction, and wherein a pitch of the plurality of first mark elements in the first direction is set such that only two first mark elements arranged at two ends of the plurality of first mark elements in the first direction are detected as two peaks when the sensor detects the light from the mark.

* * * * *